US012628365B2

(12) United States Patent
Chang et al.

(10) Patent No.: US 12,628,365 B2
(45) Date of Patent: May 12, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Cheng-Wei Chang, Taipei (TW); Shahaji B. More, Hsinchu (TW); Chi-Yu Chou, Hsinchu (TW); Yueh-Ching Pai, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 751 days.

(21) Appl. No.: 17/870,751

(22) Filed: Jul. 21, 2022

(65) Prior Publication Data

US 2024/0030318 A1 Jan. 25, 2024

(51) Int. Cl.
*H10D 30/01* (2025.01)
*H10D 30/62* (2025.01)
(Continued)

(52) U.S. Cl.
CPC ....... *H10D 30/024* (2025.01); *H10D 30/6211* (2025.01); *H10D 84/0158* (2025.01); *H10D 84/038* (2025.01); *H10D 84/834* (2025.01)

(58) Field of Classification Search
CPC .. H10D 64/017; H10D 84/038; H10D 30/014; H10D 30/43; H10D 30/6735; H10D 30/6757; H10D 62/121; H10D 62/116; H10D 64/667; H10D 30/024; H10D 62/115; H10D 30/6211; H10D 64/021; H10D 64/015; H10D 84/0158; H10D 84/0177; H10D 84/0167; H10D 84/85; H10D 30/62;
(Continued)

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |

(Continued)

FOREIGN PATENT DOCUMENTS

| | | | |
|---|---|---|---|
| TW | 202147512 | A | 12/2021 |
| TW | 202147524 | A | 12/2021 |
| TW | 202220058 | A | 5/2022 |

*Primary Examiner* — Jessica S Manno
*Assistant Examiner* — Victor Joseph Lasasso
(74) *Attorney, Agent, or Firm* — NZ Carr Law Office

(57) ABSTRACT

A semiconductor device structure, along with methods of forming such, are described. The structure includes a first plurality of vertically aligned semiconductor layers disposed over a substrate and a first gate electrode layer surrounding each of the first plurality of vertically aligned semiconductor layers. The first gate electrode layer includes first one or more work function metal layers disposed between adjacent semiconductor layers of the first plurality of vertically aligned semiconductor layers and two first conductive layers disposed on opposite sides of the first one or more work function metal layers. The first conductive layers include a material different from the first one or more work function metal layers. The first gate electrode layer further includes a second conductive layer disposed on the first conductive layers, and the second conductive layer and the first conductive layers include a same material.

20 Claims, 33 Drawing Sheets

(51) Int. Cl.
     *H10D 84/01*     (2026.01)
     *H10D 84/03*     (2025.01)
     *H10D 84/83*     (2025.01)

(58) Field of Classification Search
     CPC ............ H10D 64/517; H01L 21/02603; H01L
                   21/02532; H01L 21/28088; H01L
                   21/30604; H01L 21/31144; H01L
              21/0274; H01L 21/0262; H01L 21/2257
     See application file for complete search history.

(56)                  References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2014/0151639 A1* | 6/2014 | Chang ................ H10D 30/6757 |
| | | | 257/27 |
| 2015/0084001 A1* | 3/2015 | Cheng ................. H10K 85/221 |
| | | | 257/29 |
| 2016/0027870 A1* | 1/2016 | Cheng ................. H10D 62/121 |
| | | | 438/157 |
| 2018/0261593 A1* | 9/2018 | Cheng ................. H10D 84/038 |
| 2019/0019877 A1* | 1/2019 | Seo ...................... H10D 62/116 |
| 2021/0020644 A1* | 1/2021 | Paul .................. H01L 21/28088 |
| 2022/0399333 A1* | 12/2022 | Guler ................ H10D 30/6211 |

* cited by examiner

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-10A are cross-sectional side views of various stages of manufacturing the semiconductor device structure taken along line A-A of FIG. 4, in accordance with some embodiments.

FIGS. 6B-10B are cross-sectional side views of various stages of manufacturing the semiconductor device structure taken along line B-B of FIG. 4, in accordance with some embodiments.

FIGS. 12A-17A are cross-sectional side views of various stages of manufacturing the semiconductor device structure taken along line A-A of FIG. 11, in accordance with some embodiments.

FIGS. 12B-17B are cross-sectional side views of various stages of manufacturing the semiconductor device structure taken along line B-B of FIG. 11, in accordance with some embodiments.

FIGS. 12C-17C are cross-sectional side views of various stages of manufacturing the semiconductor device structure taken along line C-C of FIG. 11, in accordance with some embodiments.

DETAILED DESCRIPTION

Figure 1:
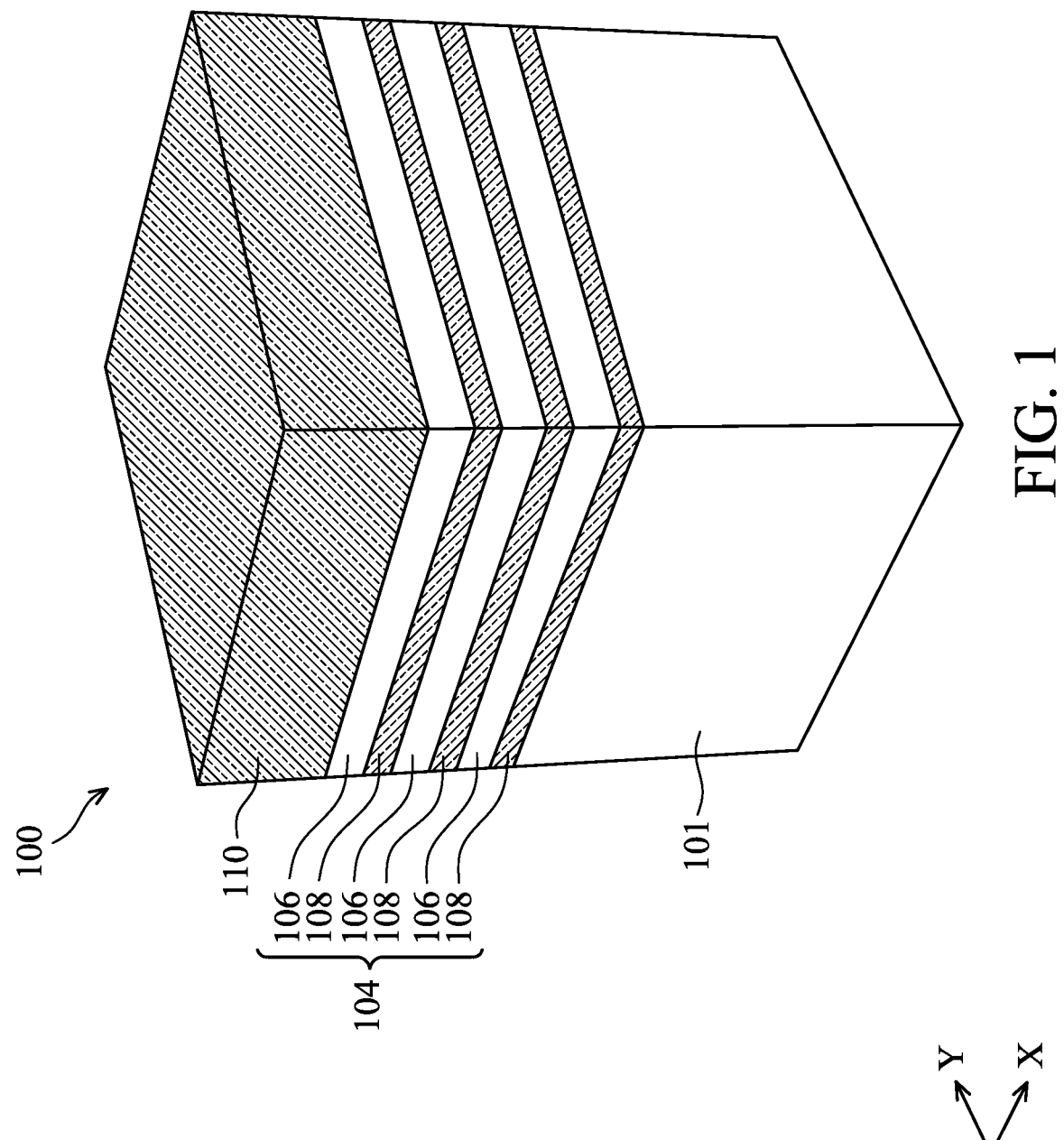
FIGS. 1-4 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-20 show exemplary sequential processes for manufacturing a semiconductor device structure 100, in accordance with some embodiments. It is understood that additional operations can be provided before, during, and after processes shown by FIGS. 1-20 and some of the operations described below can be replaced or eliminated, for additional embodiments of the method. The order of the operations/processes may be interchangeable.

FIGS. 1-4 are perspective views of various stages of manufacturing a semiconductor device structure 100, in accordance with some embodiments. As shown in FIG. 1, a stack of semiconductor layers 104 is formed over a substrate 101. The substrate 101 may be a semiconductor substrate. In some embodiments, the substrate 101 includes a crystalline semiconductor layer on at least the surface of the substrate 101. The substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (all) substrate, which includes an insulating layer (not shown) disposed between two silicon layers. In one aspect, the insulating layer is an oxide.

The substrate 101 may include various regions that have been suitably doped with impurities (e.g., p-type or n-type impurities). The dopants are, for example boron for a p-type field effect transistor (PFET) and phosphorus for an n-type field effect transistor (NFET).

The stack of semiconductor layers 104 includes first semiconductor layers 106 and second semiconductor layers 108. The first semiconductor layers 106 and the second semiconductor layers 108 are made of semiconductor materials having different etch selectivity and/or oxidation rates. For example, the first semiconductor layers 106 are made of Si and the second semiconductor layers 108 are made of SiGe. In some embodiments, the stack of semiconductor layers 104 includes alternating first and second semiconductor layers 106, 108. The first semiconductor layers 106 or portions thereof may form nanostructure channel(s), such as nanosheet channel(s), of the semiconductor device structure 100 at a later stage. The semiconductor device structure 100 may include a nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanostructure channel(s) of the semiconductor device structure 100 may be surrounded by the gate electrode layer. The nanostructure transistors may be referred to as nanosheet transistors, nanowire transistors, gate-all-around (GAA) transistors, multi-bridge channel (MBC) transistors, or any transistors having the gate electrode layer surrounding the channels. The use of the first semiconductor layers 106 to define a channel or channels of the semiconductor device structure 100 is further discussed below.

It is noted that 3 layers of the first semiconductor layers 106 and 3 layers of the second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104; the number of layers depending on the predetermined number of channels for the semiconductor device structure 100. In some embodiments, the number of first semiconductor layers 106, which is the number of channels, is between 3 and 8.

As described in more detail below, the first semiconductor layers 106 may serve as channels for the semiconductor device structure 100 and the thickness is chosen based on device performance considerations. The second semiconductor layers 108 may eventually be removed and serve to define a vertical distance between adjacent channels for the semiconductor device structure 100 and the thickness is chosen based on device performance considerations.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

A sacrificial layer 110 is formed on the stack of semiconductor layers 104. The sacrificial layer 110 may include SiGe and may be formed by any suitable deposition process, such as epitaxy.

Figure 2:
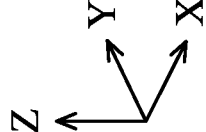
Figures 5A, 5B:
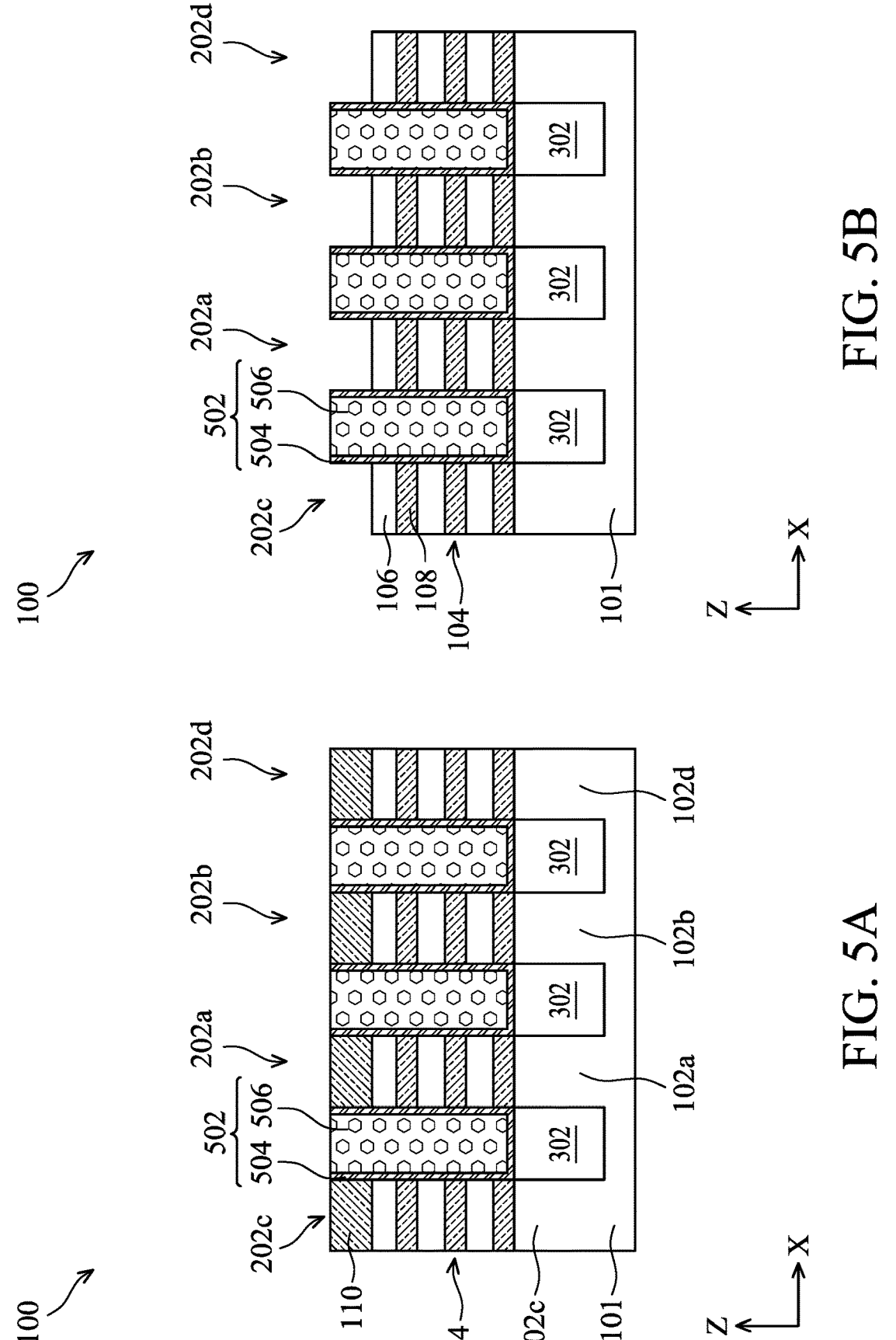
FIGS. 5A and 5B are cross-sectional side views of various stages of manufacturing the semiconductor device structure taken along line A-A of FIG. 4, in accordance with some embodiments.

FIG. 2 is a perspective view of one of the various stages of manufacturing the semiconductor device structure 100, in accordance with some embodiments. As shown in FIG. 2, fins 202a and 202b are formed. In some embodiments, each fin 202a, 202b includes a substrate portion 102a, 102b formed from the substrate 101, a portion of the stack of semiconductor layers 104, and a portion of the sacrificial layer 110. The fins 202a, 202b may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 202a, 202b by etching the stack of semiconductor layers 104 and the substrate 101. The etch process can include dry etch, wet etch, reactive ion etch (RIE), and/or other suitable processes. As shown in FIG. 2, two fins are formed, but the number of the fins is not limited to two. Three or more fins are arranged in the X direction in some embodiments, as shown in FIG. 5A.

In some embodiments, the fins 202a, 202b may be fabricated using suitable processes including photolithography and etch processes. The photolithography process may include forming a photoresist layer (not shown) over the sacrificial layer 110, exposing the resist to a pattern, performing post-exposure bake processes, and developing the resist to form a patterned resist. In some embodiments, patterning the resist to form the patterned resist may be performed using an electron beam (e-beam) lithography process. The patterned resist may then be used to protect regions of the substrate 101, and layers formed thereupon, while an etch process forms trenches 204 in unprotected regions through the sacrificial layer 110, the stack of semiconductor layers 104, and into the substrate 101, thereby leaving the extending fins 202a, 202b. The trenches 204 may be etched using a dry etch (e.g., RIE), a wet etch, and/or combination thereof.

Figure 3:
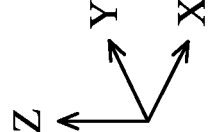

FIG. 3 is a perspective view of one of the various stages of manufacturing the semiconductor device structure 100, in accordance with some embodiments. As shown in FIG. 3, an insulating material 302 is formed on the substrate 101. The insulating material 302 fills the trench 204 (FIG. 2). The insulating material 302 may be first formed over the substrate 101 so that the fins 202a, 202b are embedded in the insulating material 302. Then, a planarization operation, such as a chemical mechanical polishing (CMP) process and/or an etch-back process, is performed such that the tops of the fins 202a, 202b (e.g., the sacrificial layer 110) are exposed from the insulating material 302, as shown in FIG. 3. The insulating material 302 may be made of an oxygen-containing material, such as silicon oxide or fluorine-doped silicate glass (FSG); a nitrogen-containing material, such as silicon nitride, silicon oxynitride (SiON), SiOCN, SiCN; a low-K dielectric material; or any suitable dielectric material. In some embodiments, the insulating material 302 includes SiOCN, SiCN, or SiN. The insulating material 302 may be formed by any suitable method, such as low-pressure chemical vapor deposition (LPCVD), plasma enhanced CVD (PECVD) or flowable CVD (FCVD).

Figure 4:
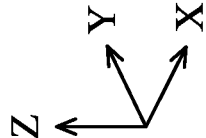

Next, as shown in FIG. 4, the insulating material 302 may be recessed by removing a portion of the insulating material 302 located between adjacent fins 202a, 202b to form trenches 402. The trenches 402 may be formed by any suitable removal process, such as dry etch or wet etch that selectively removes the insulating material 302 but not the semiconductor material of the sacrificial layer 110. The recessed insulating material 302 may be the shallow trench isolation (STI). The insulating material 302 includes a top surface 404 that may be level with or below a surface of the second semiconductor layers 108 in contact with the substrate portions 102a, 102b of the substrate 101.

FIGS. 5A and 5B are cross-sectional side views of various stages of manufacturing the semiconductor device structure 100 taken along line A-A of FIG. 4, in accordance with some embodiments. As shown in FIG. 5A, a dielectric feature 502 is formed in the trench 402 (FIG. 4) between adjacent fins 202a, 202b, 202c, 202d. The fins 202c, 202d includes substrate portions 102c, 102d, and the plurality of semiconductor layers 104 formed thereon, respectively. Each dielectric feature 502 includes a liner 504 and a sacrificial layer 506. In some embodiments, the liner 504 includes a dielectric material, such as SiOCN, and is formed by a conformal process, such as atomic layer deposition (ALD). The sacrificial layer 506 includes a dielectric material, such as an oxide formed by FCVD. A planarization process, such as a CMP process, may be performed to remove portions of the liner 504 and the sacrificial layer 506 formed on the sacrificial layer 110. As a result, the top surfaces of the sacrificial layer 110 may be substantially coplanar with the top surfaces of the sacrificial layer 506, as shown in FIG. 5A.

As shown in FIG. 5B, the sacrificial layers 110 are removed. The sacrificial layers 110 may be removed by any suitable process. In some embodiments, a selective etch process is performed to remove the sacrificial layer 110. The selective etch process does not substantially affect the materials of the liner 504, the sacrificial layer 506, and the first semiconductor layers 106.

Figures 6A, 6B:
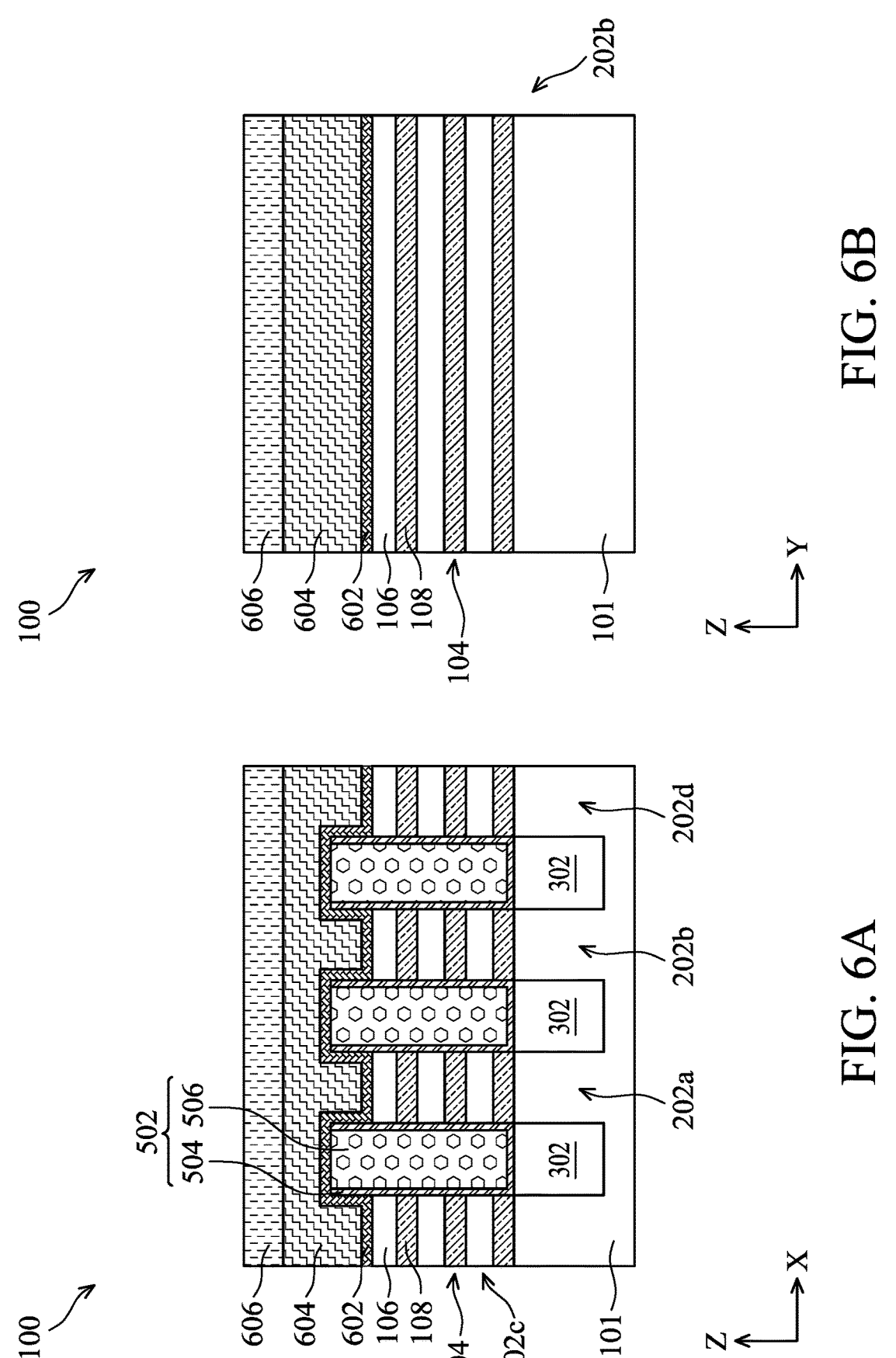

FIGS. 6A-10A are cross-sectional side views of various stages of manufacturing the semiconductor device structure 100 taken along line A-A of FIG. 4, in accordance with some embodiments. FIGS. 6B-10B are cross-sectional side views of various stages of manufacturing the semiconductor device structure 100 taken along line B-B of FIG. 4, in accordance with some embodiments. As shown in FIGS. 6A and 6B, a sacrificial gate dielectric layer 602, a sacrificial gate electrode layer 604, and a mask structure 606 are formed on the topmost first semiconductor layer 106, the liner 504, and the sacrificial layer 506. The sacrificial gate dielectric layer 602 may include one or more layers of dielectric material, such as $SiO_2$, SiOCN, SiN, a high-K dielectric material, and/or other suitable dielectric material. In some embodiments, the sacrificial gate dielectric layer 602 may include the same material as the liner 504. In some embodiments, the sacrificial gate dielectric layer 602 may be deposited by a CVD process, a sub-atmospheric CVD (SACVD) process, a FCVD process, an ALD process, a PVD process, or other suitable process. The sacrificial gate electrode layer 604 may include silicon, such as polycrystalline silicon (polysilicon), SiO, SiC, SiN, or SiCON. The mask structure 606 may include an oxygen-containing layer and a nitrogen-containing layer. In some embodiments, the sacrificial gate electrode layer 604 and the mask structure 606 are formed by various deposition processes, such as CVD (including both LPCVD and PECVD), PVD, ALD, thermal oxidation, e-beam evaporation, or other suitable deposition techniques, or combinations thereof.

Figures 7A, 7B:
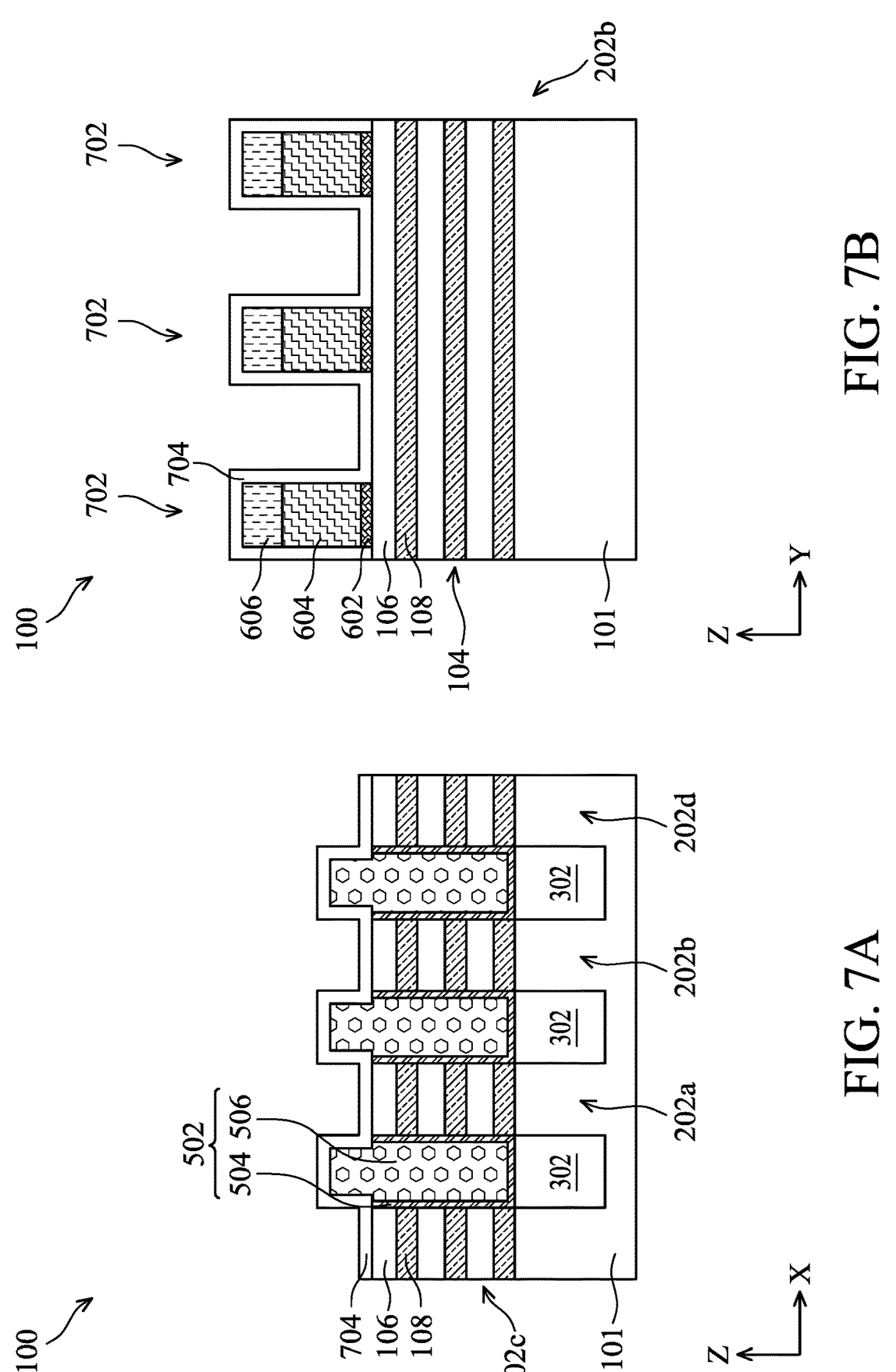

Next, as shown in FIGS. 7A and 7B, the sacrificial gate dielectric layer 602, the sacrificial gate electrode layer 604, and the mask structure 606 are patterned and etched to form one or more sacrificial gate stacks 702. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stacks 702, the stacks of semiconductor layers 104 of the fins 202a, 202b, 202c, 202d are partially exposed on opposite sides of the sacrificial gate stack 702. As shown in FIG. 7B, three sacrificial gate stacks 702 are formed, but the number of the sacrificial gate stacks 702 is not limited to three. More than three sacrificial gate stacks 702 are arranged along the Y direction in some embodiments.

As shown in FIG. 7A, the portions of the liner 504 extending over the topmost first semiconductor layer 106 are removed during the patterning of the sacrificial gate stacks 702, and portions of the sacrificial layer 506 are exposed. As shown in FIGS. 7A and 7B, a spacer 704 is formed on the sacrificial gate stacks 702, the exposed portions of the sacrificial layer 506, and the topmost first semiconductor layer 106. The spacer 704 may be a conformal layer and may be formed by a conformal process, such as ALD process. The spacer 704 may be made of a dielectric material such as silicon oxide, silicon nitride, silicon carbide, silicon oxynitride, SiCN, silicon oxycarbide, SiOCN, and/or combinations thereof. In some embodiments, the spacer 704 includes multiple layers, such as main spacer walls, liner layers, and the like.

Figures 8A, 8B:
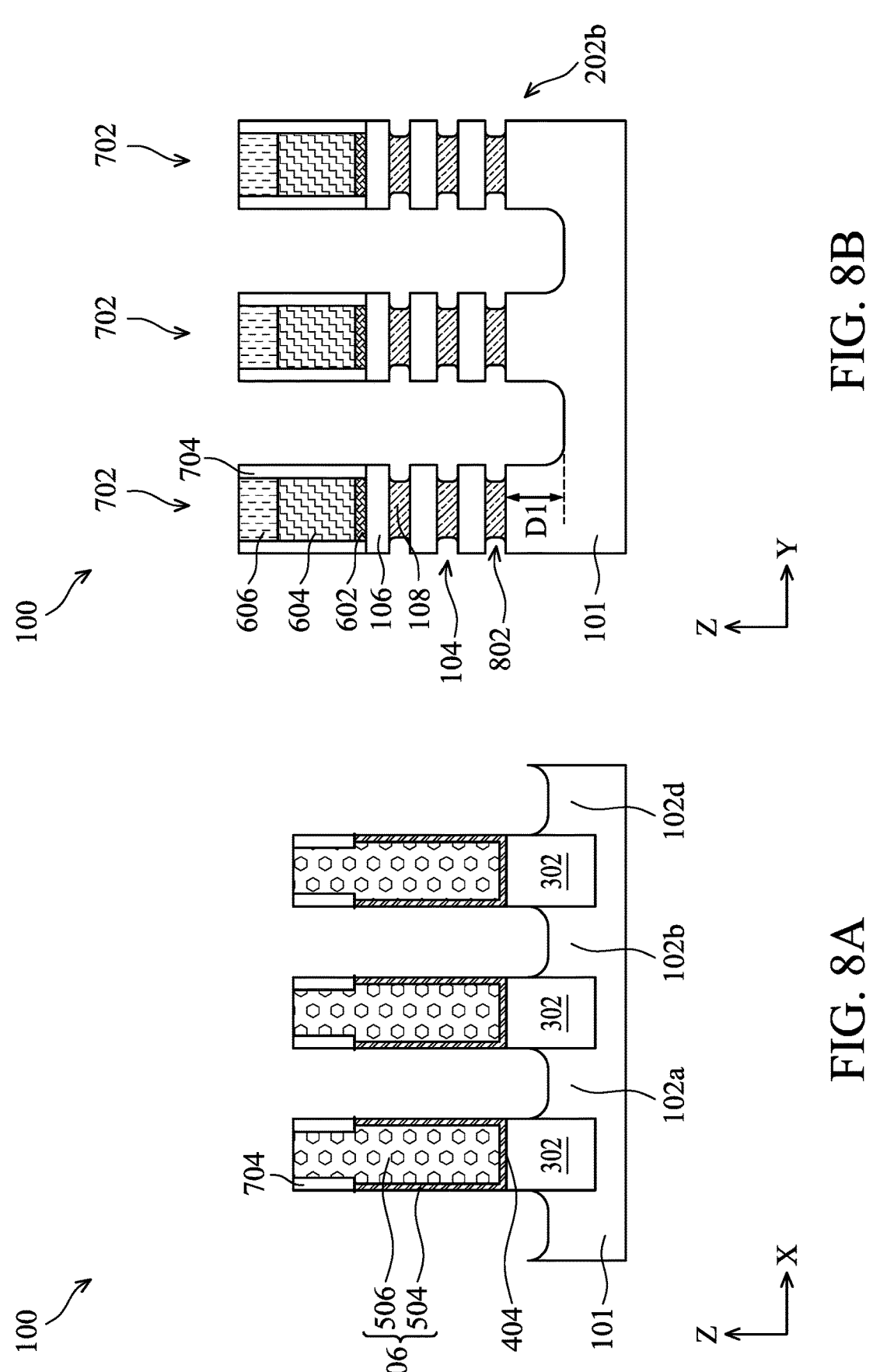

As shown in FIGS. 8A and 8B, portions of the spacer 704 are removed, and the remaining portions of the spacer 704 are disposed on sidewalls of the sacrificial gate stacks 702 and the sacrificial layer 506. The portions of the spacer 704 may be removed by an anisotropic etch. During the anisotropic etch process, most of the spacer 704 is removed from horizontal surfaces, such as the tops of the fins 202a, 202b, 202c, 202d, the sacrificial gate stacks 702, and the sacrificial layers 506, leaving the spacers 704 on the vertical surfaces, such as the sidewalls of sacrificial gate stack 702 and the portions of the sidewalls of the sacrificial layer 506.

Next, exposed portions of the fins 202a, 202b, 202c, 202d not covered by the sacrificial gate stacks 702 and the spacers 704 are selectively recessed by using one or more suitable etch processes, such as dry etch, wet etch, or a combination thereof. In some embodiments, exposed portions of the stacks of semiconductor layers 104 (FIG. 7A) of the fins 202a, 202b, 202c, 202d are removed, exposing portions of the substrate portions 102a, 102b, respectively. As shown in FIG. 8A, the exposed portions of the fins 202a, 202b, 202c, 202d are recessed to a level below the top surface 404 of the insulating material 302. As shown in FIG. 8B, the exposed portions of the fin 202b (also fins 202a, 202c, 202d) are recessed to a level that is about a distance D1 from the level of the bottommost second semiconductor layer 108. The distance D1 may range from about 5 nm to about 20 nm.

At this stage, end portions of the stacks of semiconductor layers 104 under the sacrificial gate stacks 702 and the spacers 704 have substantially flat surfaces which may be flush with corresponding spacers 704. Next, as shown in FIG. 8B, the edge portions of each second semiconductor layer 108 are removed, forming gaps 802. In some embodiments, the portions of the second semiconductor layers 108 are removed by a selective wet etch process that does not remove the first semiconductor layers 106. For example, in cases where the second semiconductor layers 108 are made of SiGe and the first semiconductor layers 106 are made of silicon, a selective wet etch including an ammonia and hydrogen peroxide mixtures (APM) may be used.

Figures 9A, 9B:
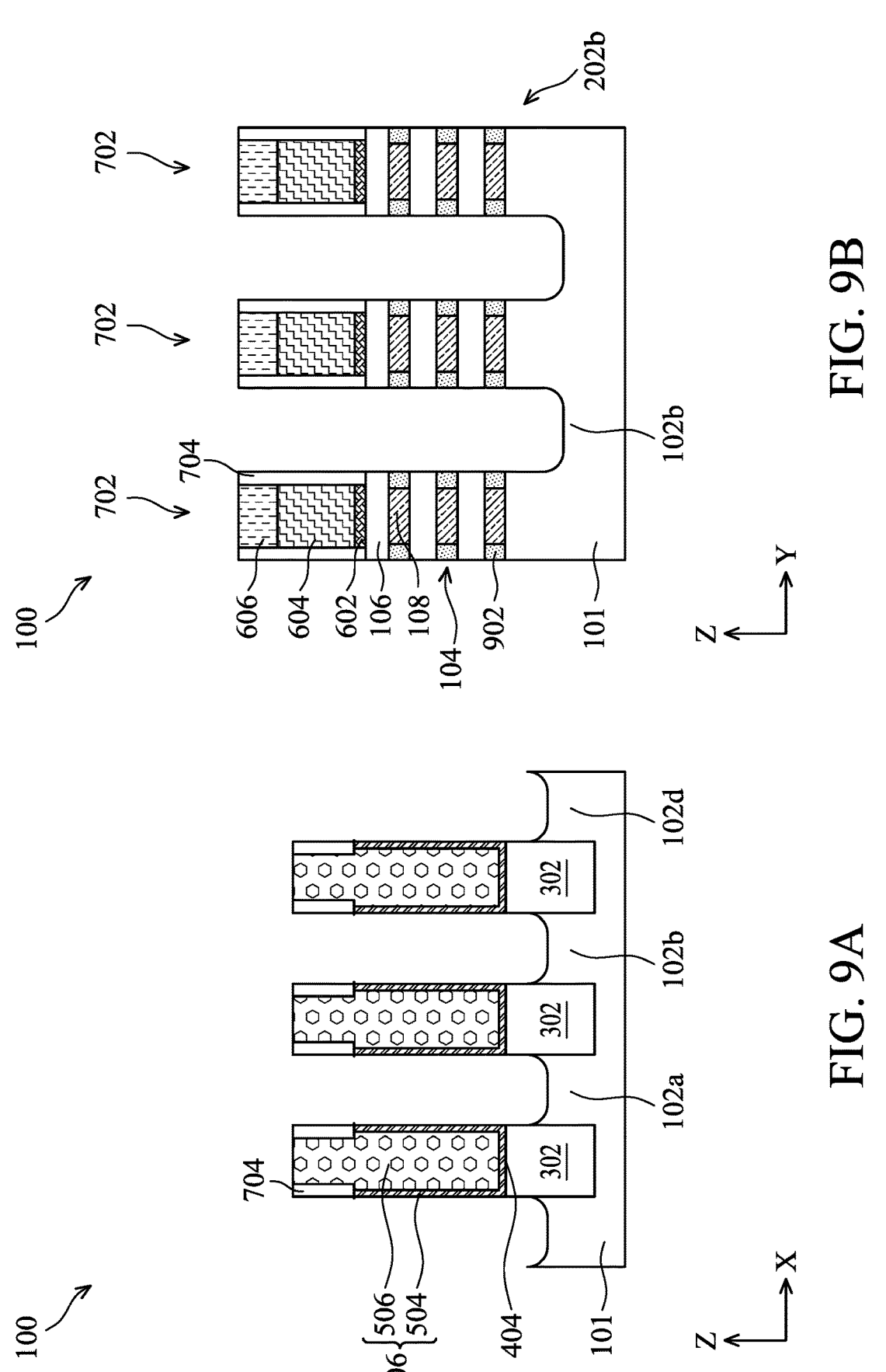

Next, as show in FIGS. 9A and 9B, dielectric spacers 902 are formed in the gaps 802. In some embodiments, the dielectric spacers 902 may be made of SiON, SiCN, SiOC, SiOCN, SiN, or any suitable dielectric material. In some embodiments, the dielectric spacers 902 may be formed by first forming a conformal dielectric layer using a conformal deposition process, such as ALD, followed by an anisotropic etch to remove portions of the conformal dielectric layer other than the dielectric spacers 902. The dielectric spacers 902 may be protected by the first semiconductor layers 106 and the spacers 704 during the anisotropic etch process. In some embodiments, the dielectric spacers 902 may be flush with the spacers 704.

Figures 10A, 10B:
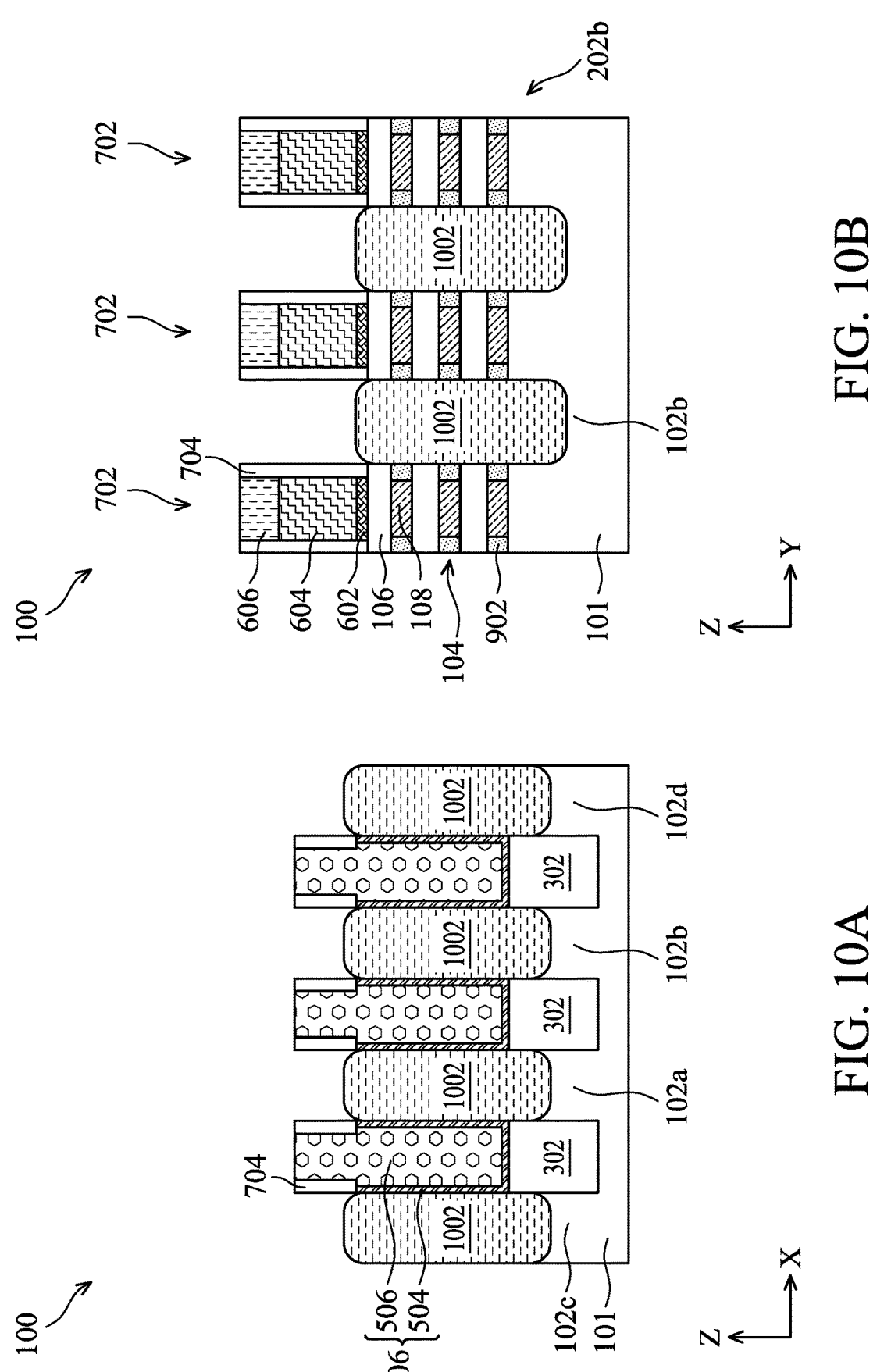

Next, as shown in FIGS. 10A and 10B, source/drain (S/D) epitaxial features 1002 are formed on the substrate portions 102a, 102b, 102c, 102d of the fins 202a, 202b, 202c, 202d. The S/D epitaxial feature 1002 may include one or more layers of Si, SiP, SiC and SiCP for an n-channel FET or Si, SiGe, Ge for a p-channel FET. The S/D epitaxial features 1002 are formed by an epitaxial growth method using CVD or MBE. The S/D epitaxial features 1002 are in contact with the first semiconductor layers 106 and dielectric spacers 902. The S/D epitaxial features 1002 may be the S/D regions. In this disclosure, a source and a drain are interchangeably used, and the structures thereof are substantially the same. Furthermore, source/drain region(s) may refer to a source or a drain, individually or collectively dependent upon the context.

Figure 11:
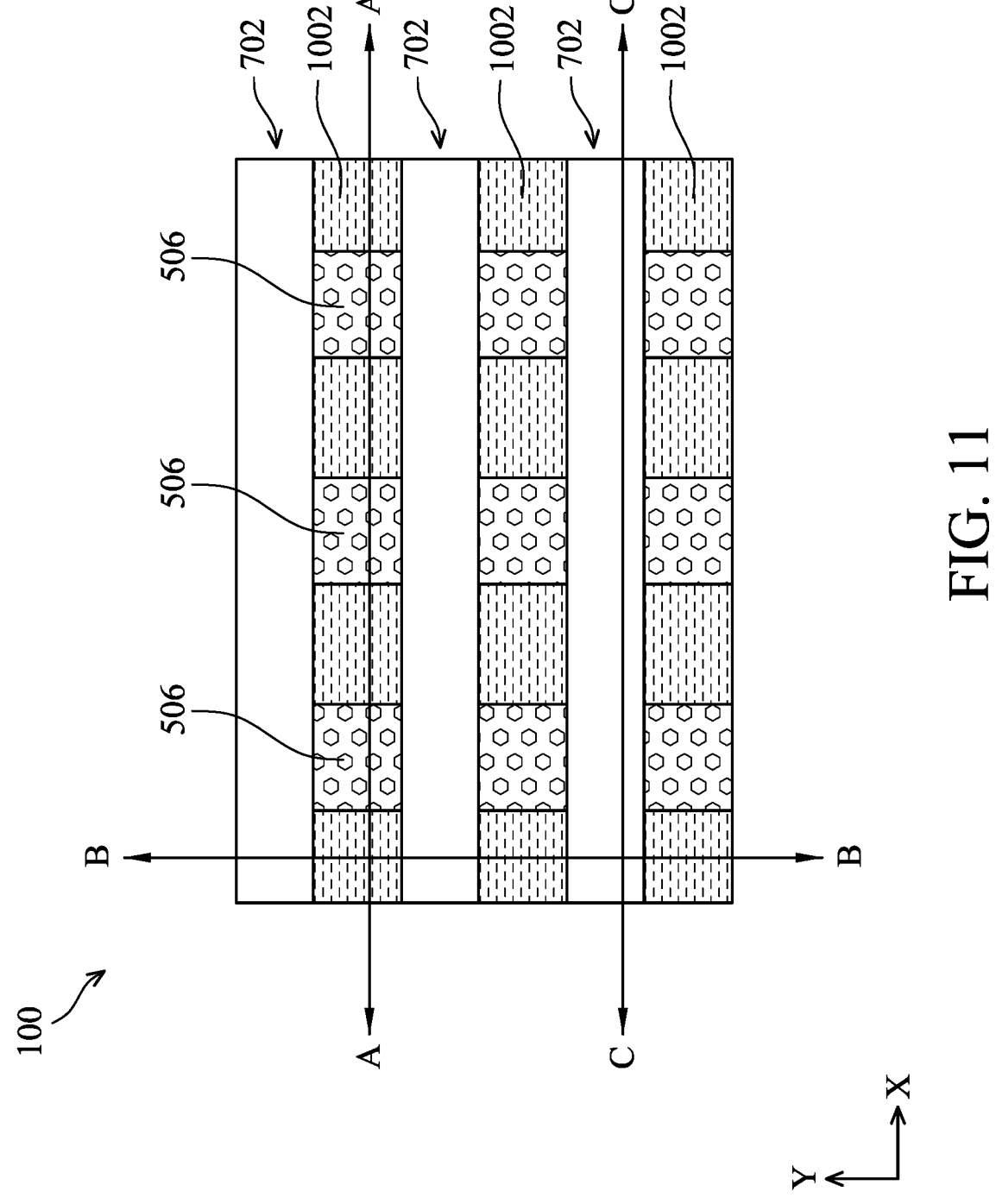
FIG. 11 is a top view of the semiconductor device structure of FIGS. 10A and 10B, in accordance with some embodiments.

FIG. 11 is a top view of the semiconductor device structure 100 of FIGS. 10A and 10B, in accordance with some embodiments. The spacers 704 are omitted in FIG. 11 for clarity. As shown in FIG. 11, the sacrificial gate stacks 702 are disposed along the Y direction, the S/D epitaxial features 1002 are disposed on opposite sides of the sacrificial gate stacks 702, and the sacrificial layers 506 are disposed between adjacent S/D epitaxial features 1002.

Figures 12A, 12B:
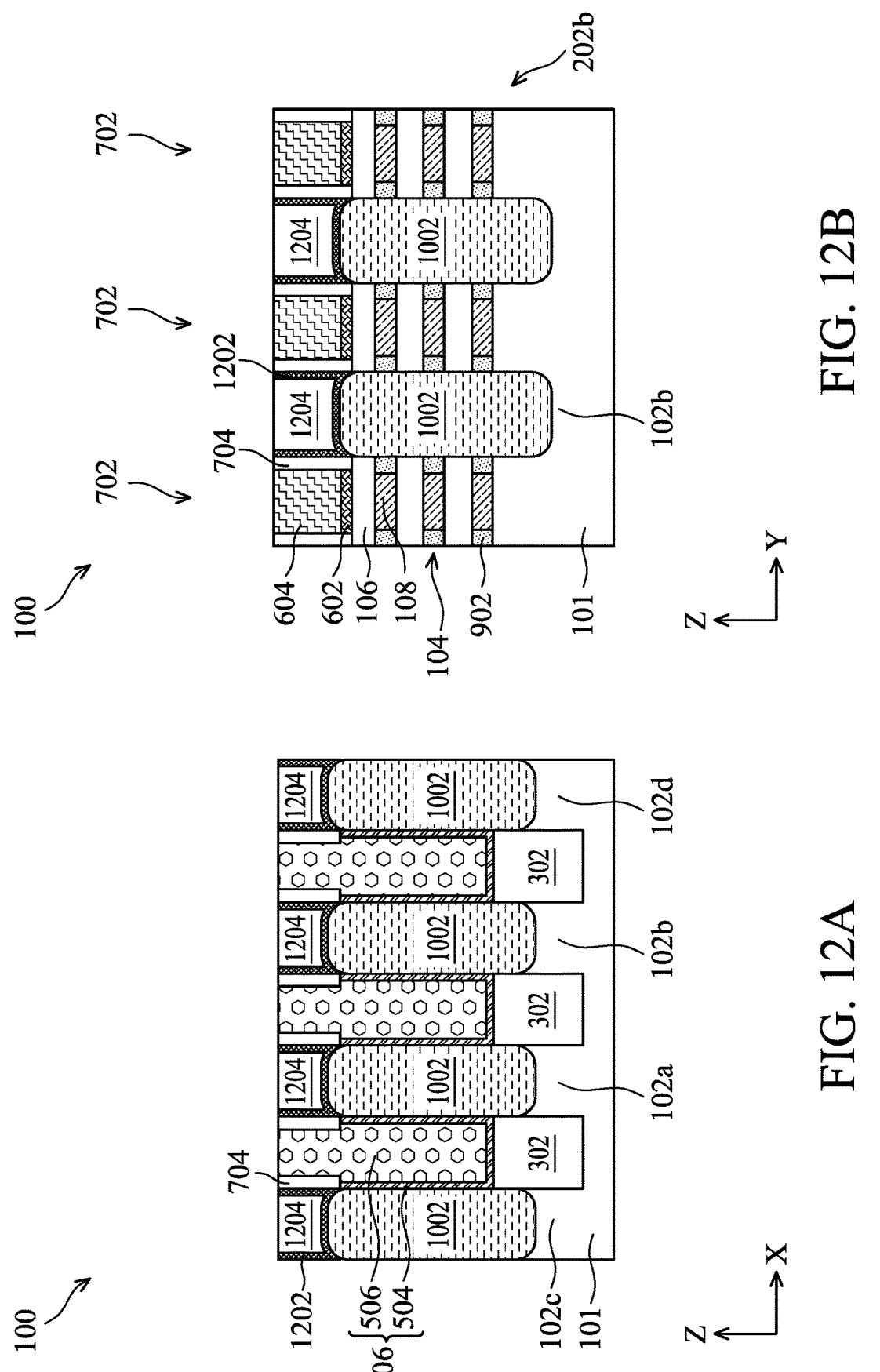

FIGS. 12A-17A are cross-sectional side views of various stages of manufacturing the semiconductor device structure 100 taken along line A-A of FIG. 11, in accordance with some embodiments. FIGS. 12B-17B are cross-sectional side views of various stages of manufacturing the semiconductor device structure 100 taken along line B-B of FIG. 11, in accordance with some embodiments. FIGS. 12C-17C are cross-sectional side views of various stages of manufacturing the semiconductor device structure 100 taken along line C-C of FIG. 11, in accordance with some embodiments. As shown in FIGS. 12A, 12B, 12C, a contact etch stop layer (CESL) 1202 may be formed on the S/D epitaxial features 1002 and adjacent the spacers 704. The CESL 1202 may include an oxygen-containing material or a nitrogen-containing material, such as silicon nitride, silicon carbon nitride, silicon oxynitride, carbon nitride, silicon oxide, silicon carbon oxide, the like, or a combination thereof. The CESL 1202 may be formed by CVD, PECVD, ALD, or any suitable deposition technique. In some embodiments, the CESL 1202 is a conformal layer formed by the ALD process. An interlayer dielectric (ILD) layer 1204 may be formed on the CESL 1202. The materials for the ILD layer 1204 may include oxide formed with tetraethylorthosilicate (TEOS), un-doped silicate glass, doped silicon oxide such as borophosphosilicate glass (BPSG), fused silica glass (FSG), phosphosilicate glass (PSG), boron doped silicon glass (BSG), and/or other suitable dielectric materials. The ILD layer 1204 may be deposited by a PECVD process or other suitable deposition technique. In some embodiments, after formation of the ILD layer 1204, the semiconductor device structure 100 may be subject to a thermal process to anneal the ILD layer 1204.

Figure 12C:
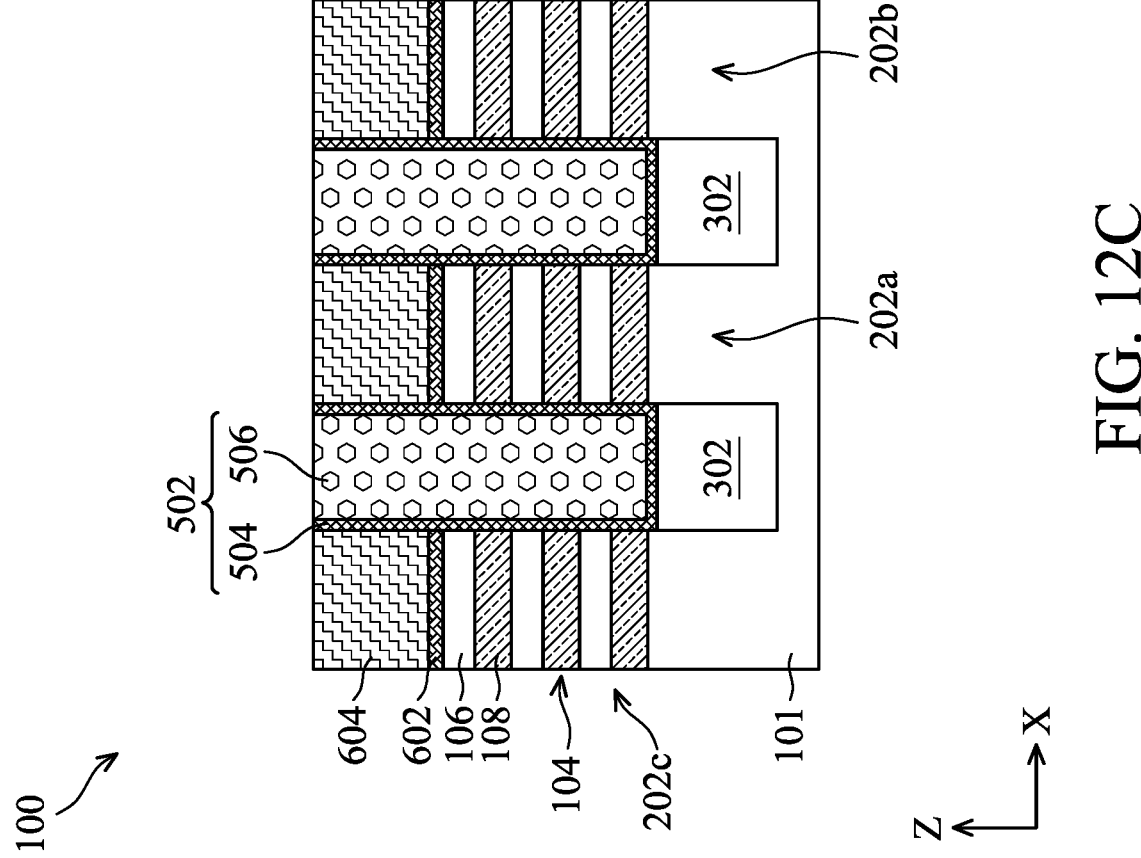

A planarization process is performed to expose the sacrificial gate electrode layer 604, as shown in FIGS. 12B and 12C. The planarization process may be any suitable process, such as a CMP process. The planarization process removes portions of the ILD layer 1204 and the CESL 1202 disposed on the sacrificial gate stacks 702. The planarization process may also remove the mask structure 606 (FIG. 10B). In some embodiments, a portion of the sacrificial gate electrode layer 604 disposed on the dielectric feature 502 may be removed by the planarization process, and the dielectric features 502 are exposed, as shown in FIG. 12C. In some embodiments, the ILD layer 1204 may be recessed to a level below the top of the sacrificial gate electrode layer 604, and a nitrogen-containing layer (not shown), such as a SiCN layer, may be formed on the recessed ILD layer 1204. The nitrogen-containing layer may protect the ILD layer 1204 during subsequent etch processes.

Figures 13A, 13B:
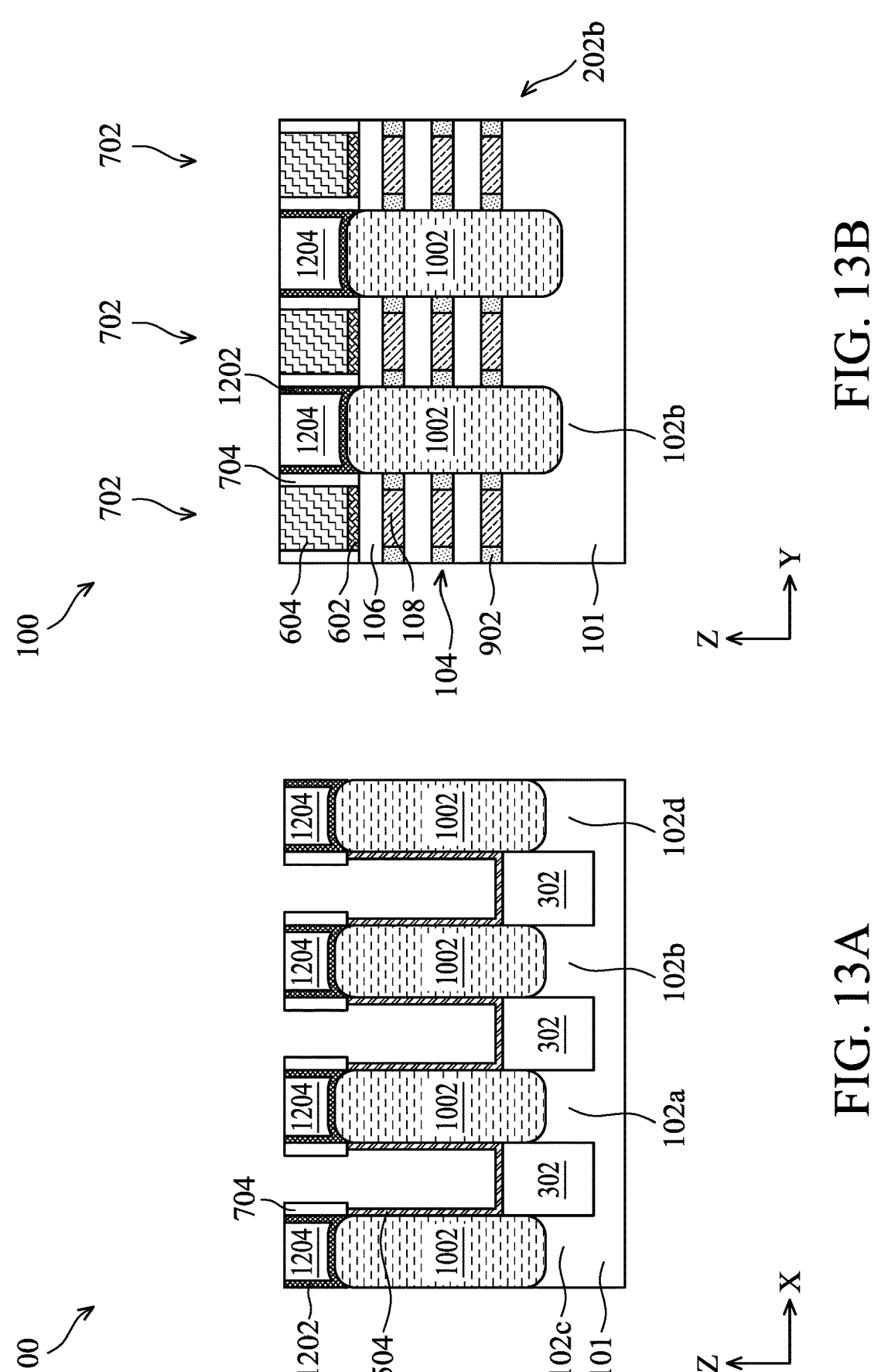
Figure 13C:
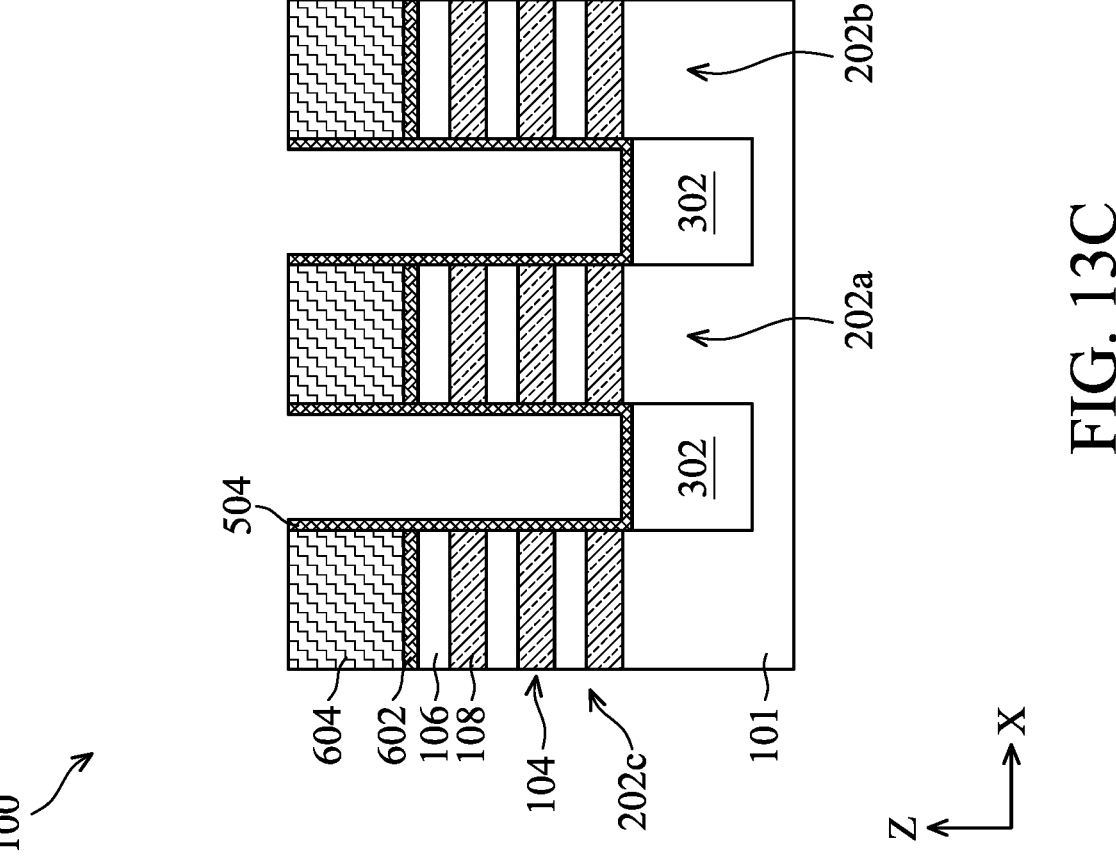

As shown in FIGS. 13A, 13B, 13C, the sacrificial layers 506 are removed. The sacrificial layers 506 may be removed by any suitable process, such as a dry etch, a wet etch, or a combination thereof. The removal of the sacrificial layers 506 may be a selective process that does not substantially affect the sacrificial gate electrode layer 604, the spacers 704, the CESL 1202, and the ILD layer 1204 (or the nitrogen-containing layer (not shown) disposed on the ILD layer 1204).

Figures 14A, 14B:
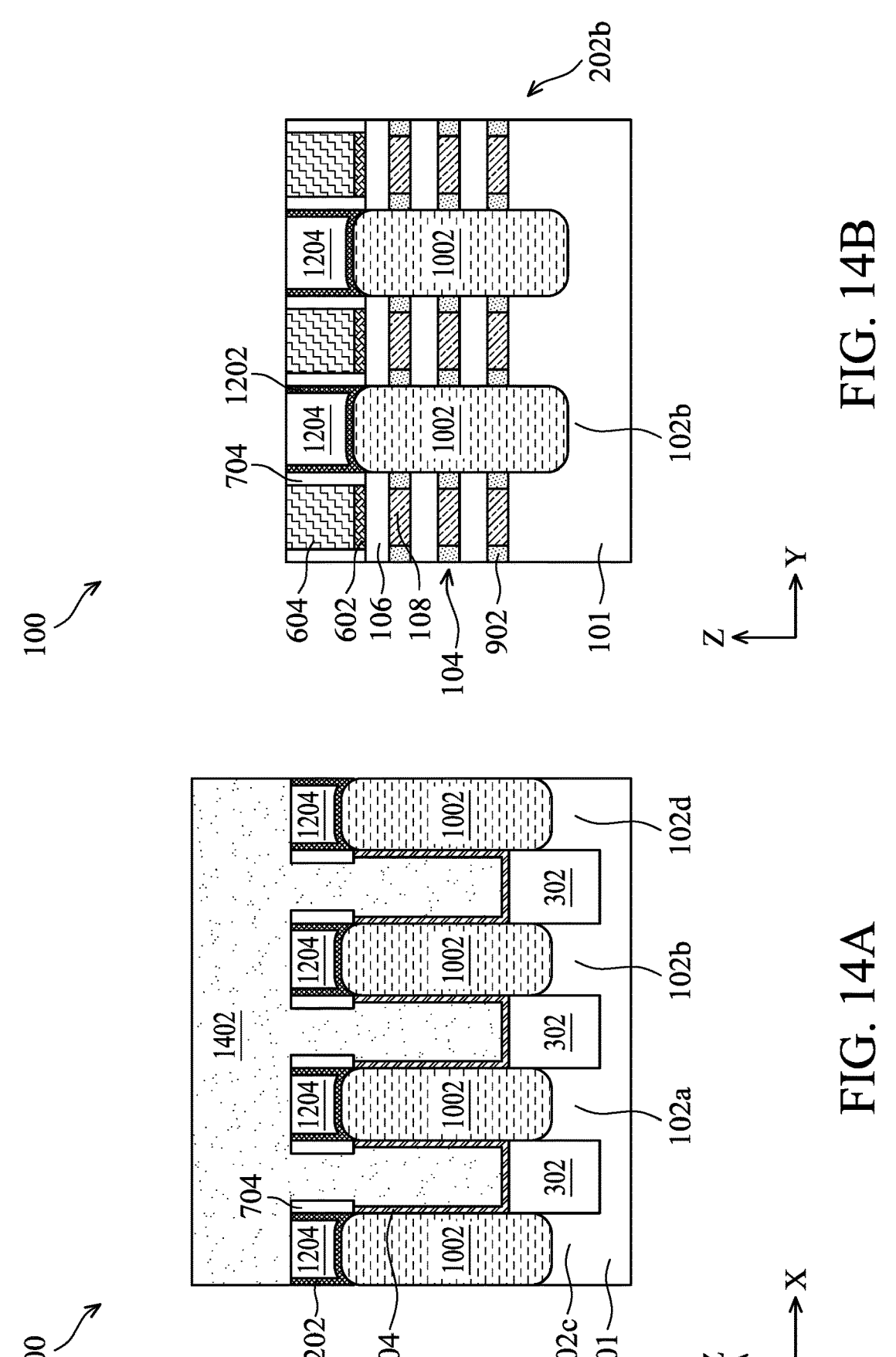
Figure 14C:
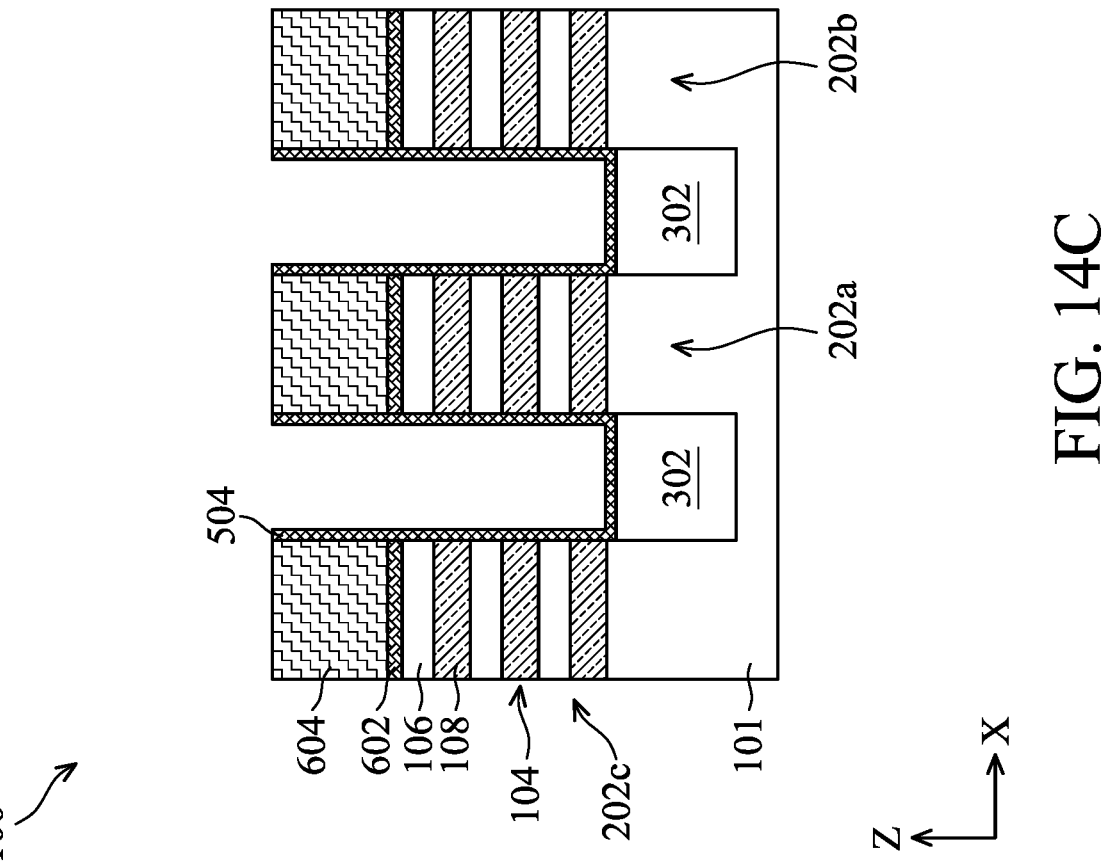

As shown in FIGS. 14A, 14B, 14C, a mask 1402 is formed on the liner 504 and spacers 704 between adjacent S/D epitaxial features 1002. The mask 1402 is not formed on the liner 504 located between the pluralities of semiconductor layers 104 and between the sacrificial gate electrode layers 604. In other words, the mask 1402 is formed in the S/D regions but not in the channel regions.

Figures 15A, 15B:
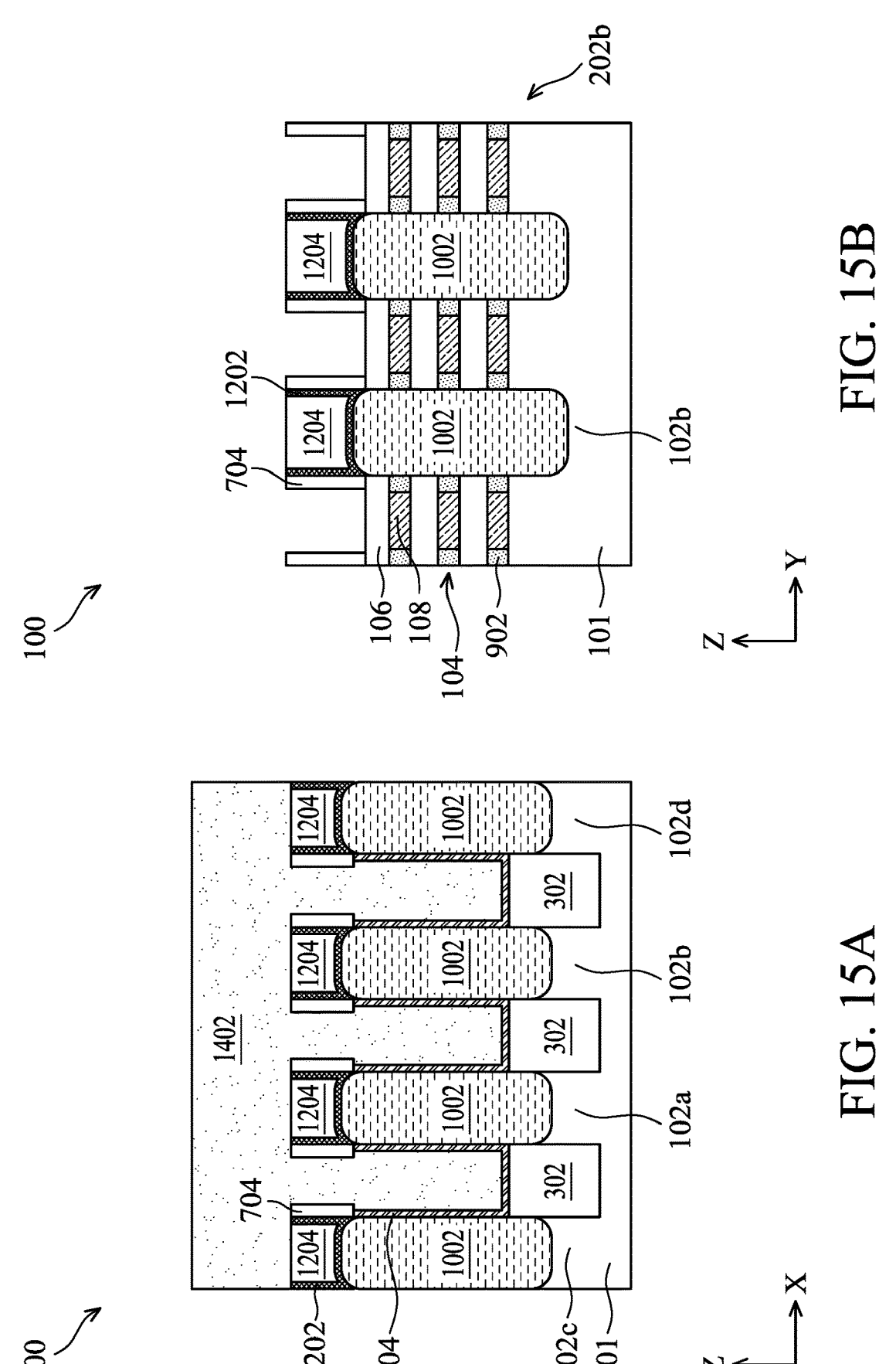
Figure 15C:
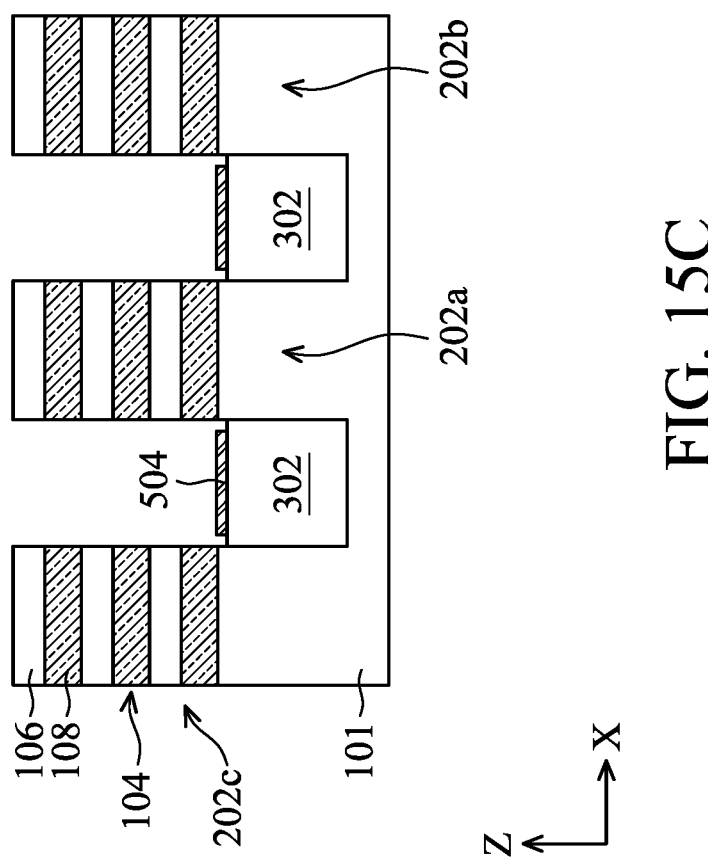
Figure 15C:
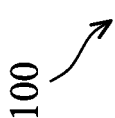

As shown in FIGS. 15A, 15B, 15C, the sacrificial gate electrode layer 604, the sacrificial gate dielectric layer 602, and vertical portions of the liner 504 located between the pluralities of semiconductor layers 104 are removed. In some embodiments, multiple selective etch processes are performed to remove the sacrificial gate electrode layer 604, the sacrificial gate dielectric layer 602, and vertical portions of the liner 504 located between the pluralities of semiconductor layers 104. For example, a first selective etch process is performed to remove the vertical portions of the liner 504 located between the pluralities of semiconductor layers 104, a second selective etch process is performed to remove the sacrificial gate electrode layer 604, and a third selective etch process is performed to remove the sacrificial gate dielectric layer 602. The first selective etch process does not remove the horizontal portion of the liner 504 located at the bottom of the opening (the portion of the liner 504 disposed on the insulating material 302) because not much etchant flowed to the bottom of the opening during the first selective etch process. The multiple selective etch processes do not substantially affect the mask 1402, the spacers 704, the CESL 1202, and the ILD layer 1204 (or the nitrogen-containing layer (not shown) disposed on the ILD layer 1204).

Figures 16A, 16B:
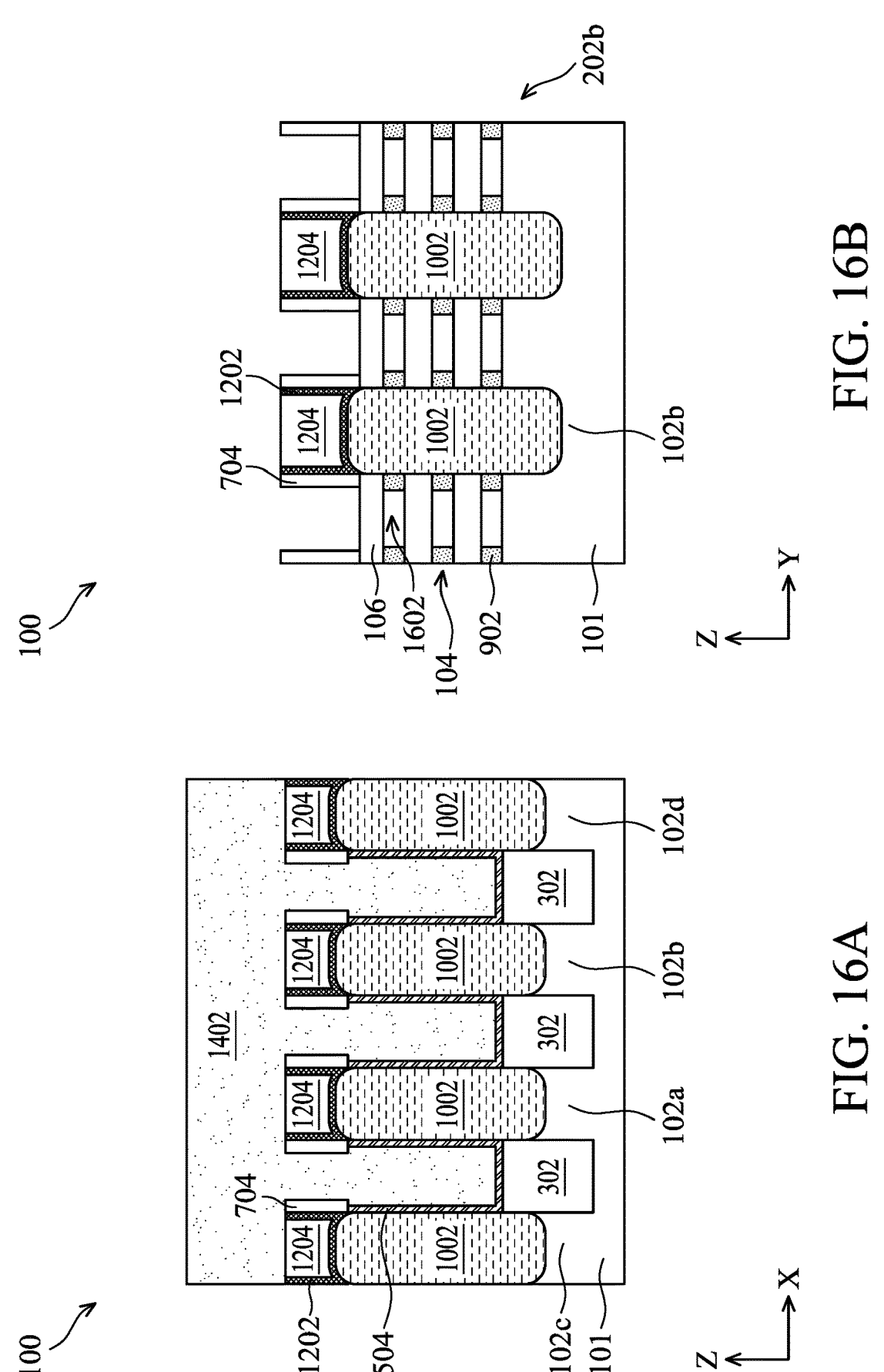
Figure 16C:
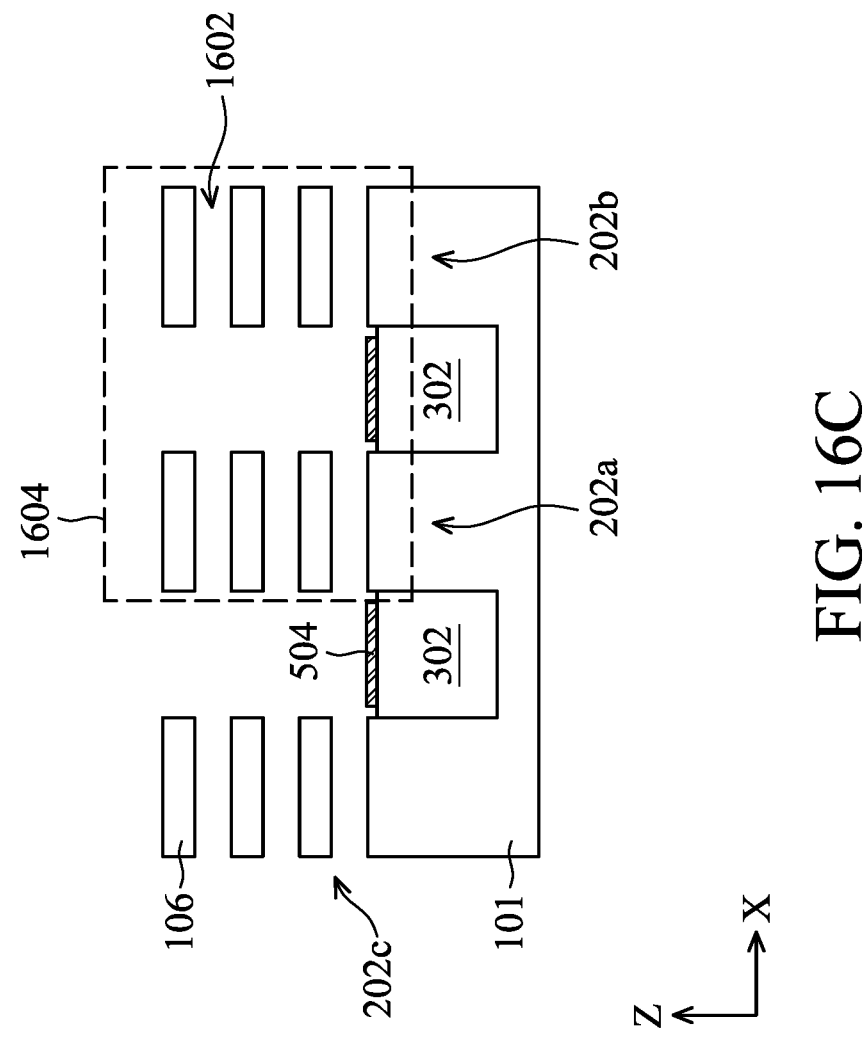

As shown in FIGS. 16A, 16B, 16C, the second semiconductor layers 108 are removed. The removal process may be any suitable processes, such as dry etch, wet etch, or a combination thereof. The etch process may be a selective etch process that removes the second semiconductor layers 108 but not the mask 1402, the spacers 704, the CESL 1202, and the ILD layer 1204 (or the nitrogen-containing layer (not shown) disposed on the ILD layer 1204). As a result, openings 1602 are formed, as shown in FIGS. 16B and 16C. The portion of the first semiconductor layers 106 not covered by the dielectric spacers 902 may be exposed in the openings 1602. Each first semiconductor layer 106 may be a nanosheet channel of the nanosheet transistor.

Figures 17A, 17B:
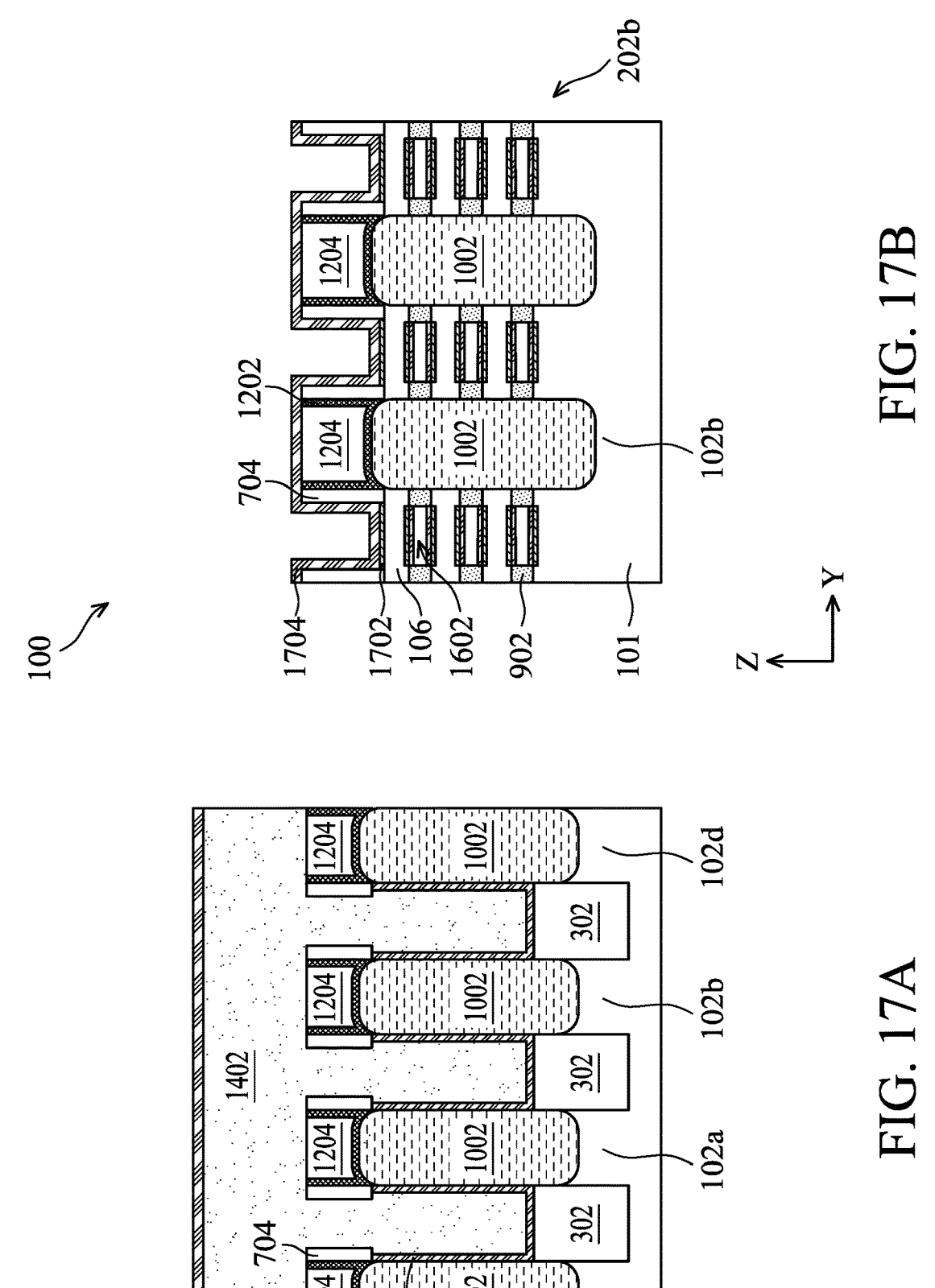
Figure 17C:
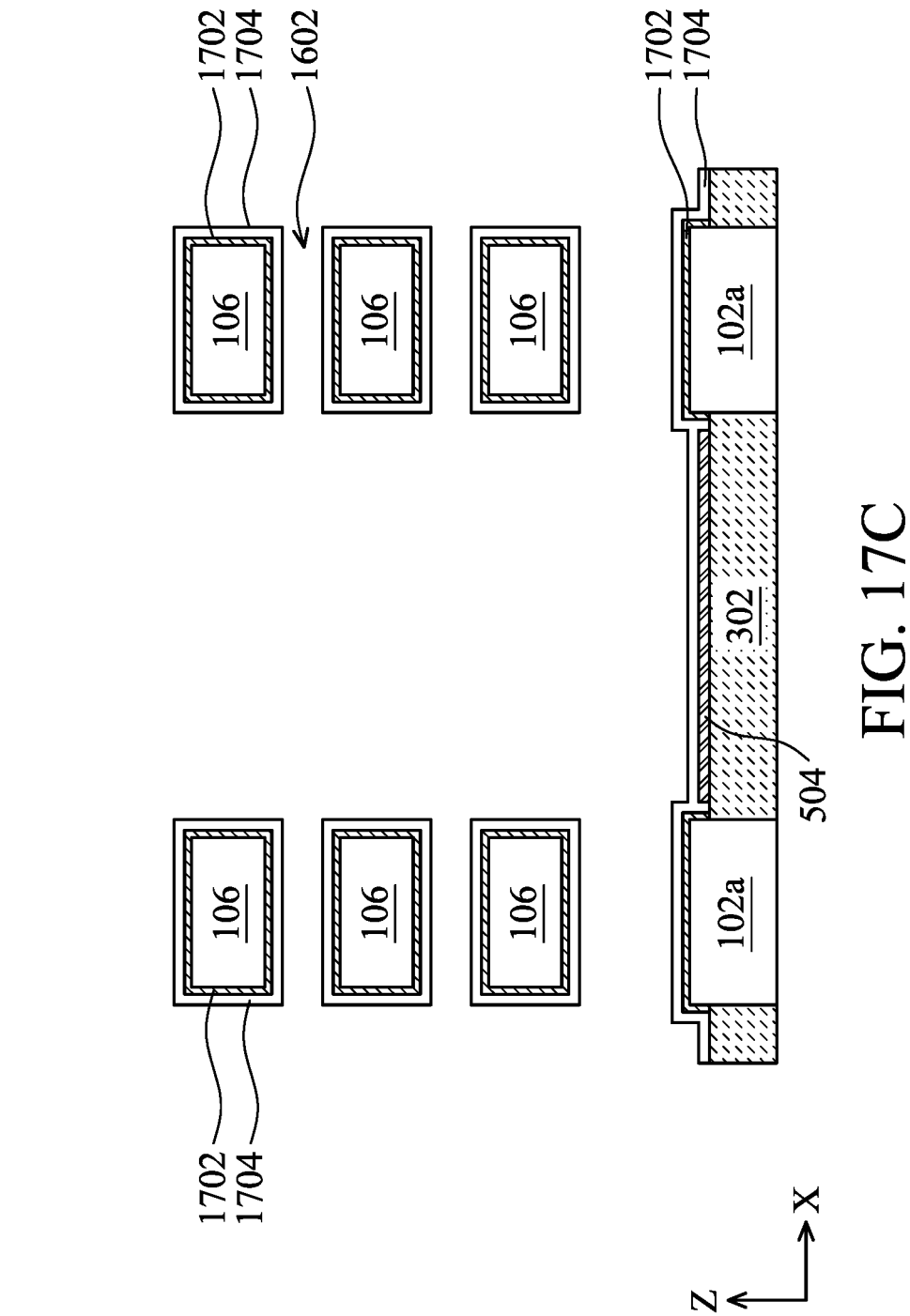

FIG. 17C is an enlarged portion 1604 of the semiconductor device structure 100 shown in FIG. 16C. As shown in FIGS. 17A, 17B, 17C, oxygen-containing layers 1702 may be formed around the exposed surfaces of the first semiconductor layers 106 and the substrate portions 102a, 102b, 102c, 102d of the fins 202a, 202b, 202c, 202d in the openings 1602, followed by forming gate dielectric layers 1704 on the oxygen-containing layers 1702 in the openings 1602. The oxygen-containing layer 1702 may be an oxide layer, and the gate dielectric layer 1704 may include the same material as the sacrificial gate dielectric layer 602 (FIGS. 6A and 6B). In some embodiments, the gate dielectric layer 1704 includes a high-K dielectric material, such as $HfO_x$ or $HfO_xCl_y$. The oxygen-containing layers 1702 and the gate dielectric layers 1704 may be formed by any suitable processes, such as ALD processes. In some embodiments, the oxygen-containing layers 1702 and the gate dielectric layers 1704 are formed by conformal processes. In some embodiments, the oxygen-containing layers 1702 are formed on the semiconductor material of the first semiconductor layer 106 and the substrate portions 102a, 102b, 102c, 102d, but not formed on the dielectric materials of the liner 504, the spacers 704, and the ILD layer 1204.

Figure 18A:
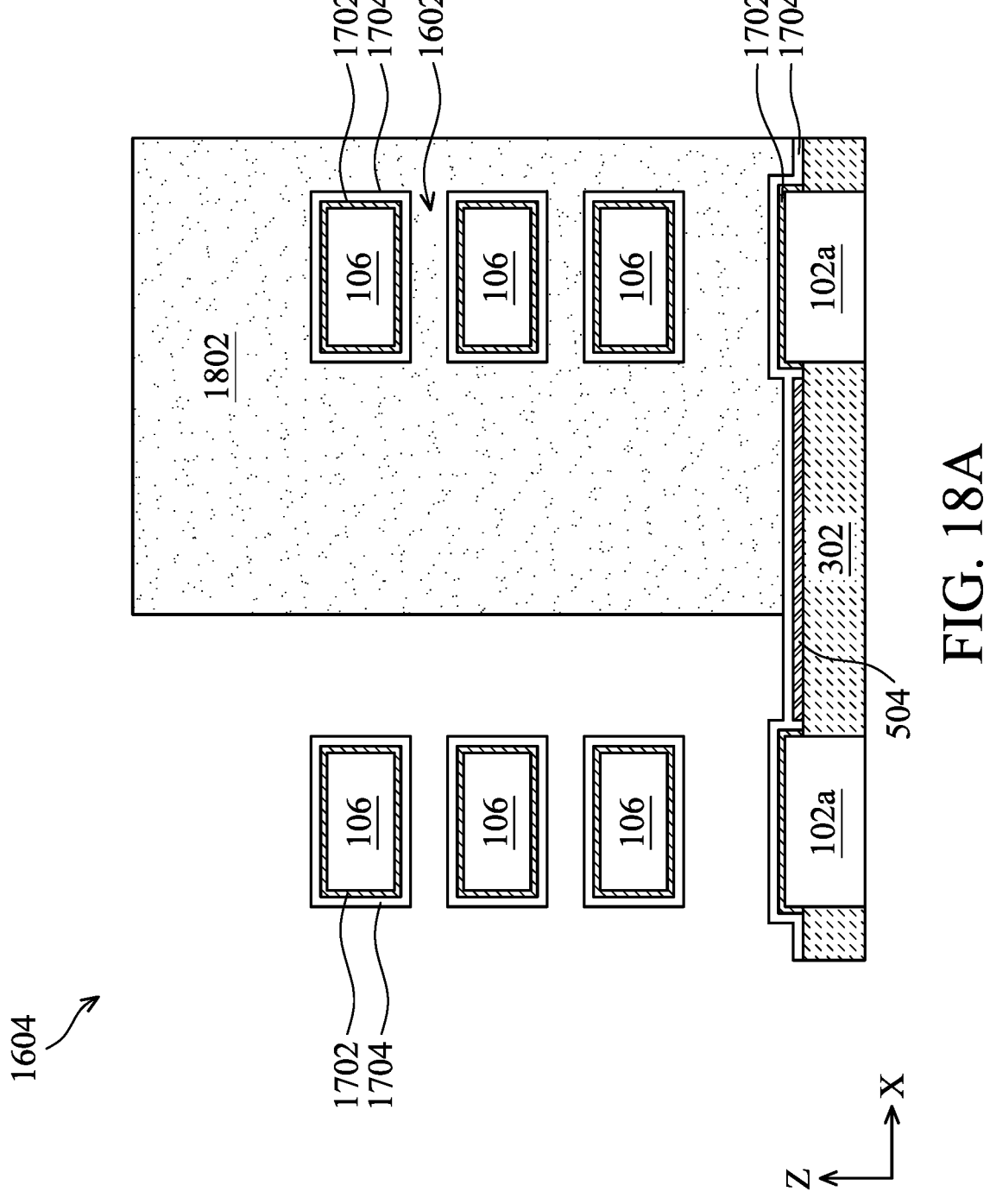
FIGS. 18A-18H are cross-sectional views of various stages of manufacturing the semiconductor device structure, in accordance with some embodiments.
Figure 18B:
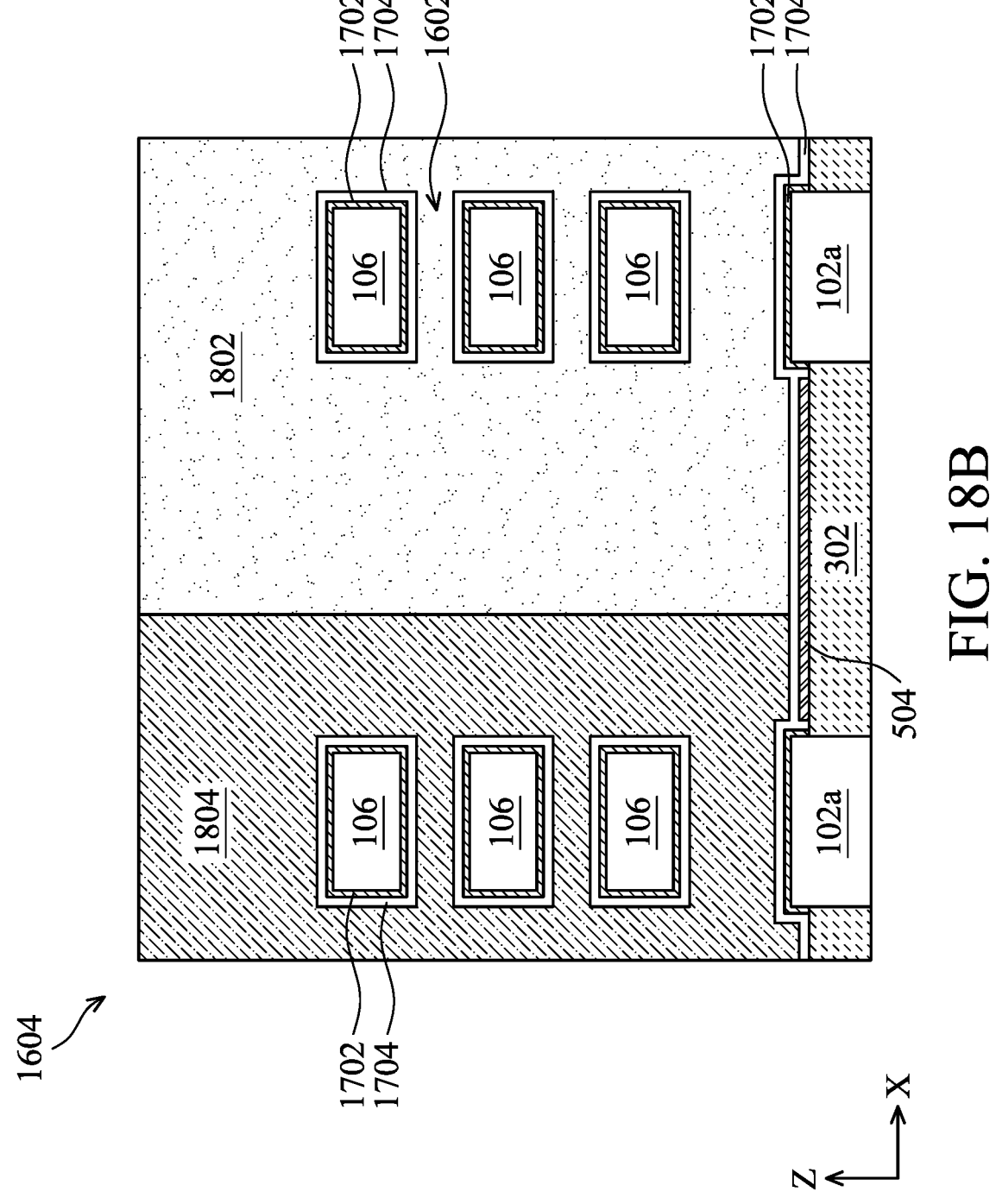

FIGS. 18A-18H are cross-sectional views of various stages of manufacturing the semiconductor device structure, in accordance with some embodiments. As shown in FIG. 18A, a mask 1802 is formed to embed the first semiconductor layers 106 of the fin 202b, while the first semiconductor layers 106 of the fin 202a are exposed. Next, as shown in FIG. 18B, one or more work function metal (WFM) layers 1804 are formed in the openings 1602 to surround the exposed first semiconductor layers 106. The one or more WFM layers 1804 include an electrically conductive material, such as Ti, Al, Ta, $ZrSi_2$, TaN, $TaSi_x$, $MoSi_2$, $NiSi_x$, W, HfN, TiN, Mo, Ru, Jr, Pt, PtSi, MoN, or other suitable electrically conductive material. In some embodiments, the one or more WFM layers 1804 include n-type conductive material, such as Ti, Al, Ta, $ZrSi_2$, TaN, or p-type conductive material, such as Mo, Ru, Ir, Pt, PtSi, MoN. For example, the one or more WFM layers 1804 include p-type conductive material.

Figure 18C:
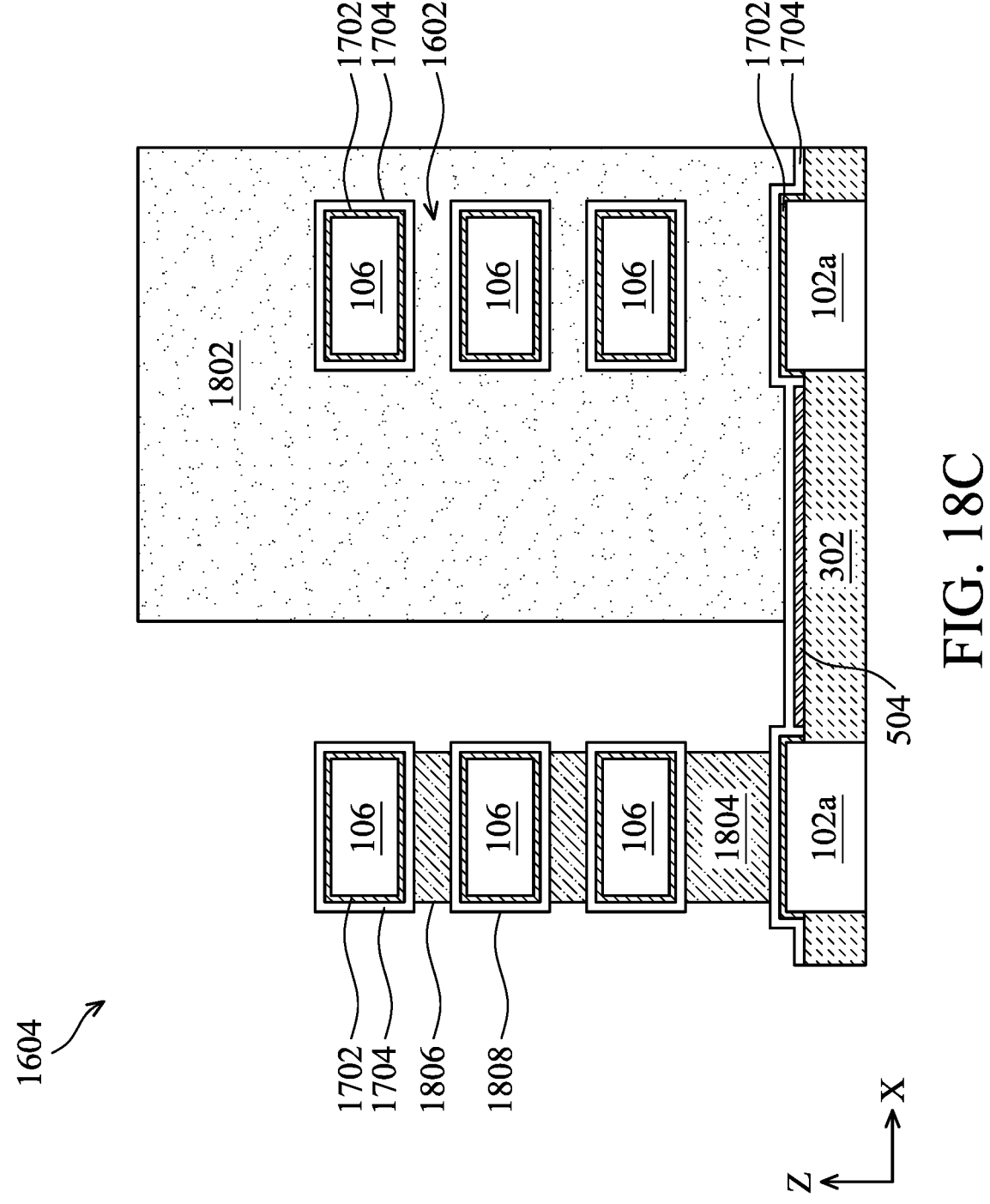

As shown in FIG. 18C, the one or more WFM layers 1804 are recessed. The recess of the one or more WFM layers 1804 may be performed by a selective etch process that does not substantially affect the gate dielectric layers 1704. The remaining one or more WFM layers 1804 are located between vertically adjacent first semiconductor layers 106, and each portion of the one or more WFM layers 1804 located between two vertically adjacent first semiconductor layers 106 has an edge surface 1806. In some embodiments, the edge surface 1806 is not flush with an outer surface 1808 of the gate dielectric layer 1704 surrounding one of the two vertically adjacent first semiconductor layers 106. In other words, the outer surface 1808 of the gate dielectric layer 1704 is misaligned with the edge surface 1806 of the one or more WFM layers 1804. In some embodiments, the edge surface 1806 is recessed from the outer surface 1808, as shown in FIG. 18C.

Figure 18D:
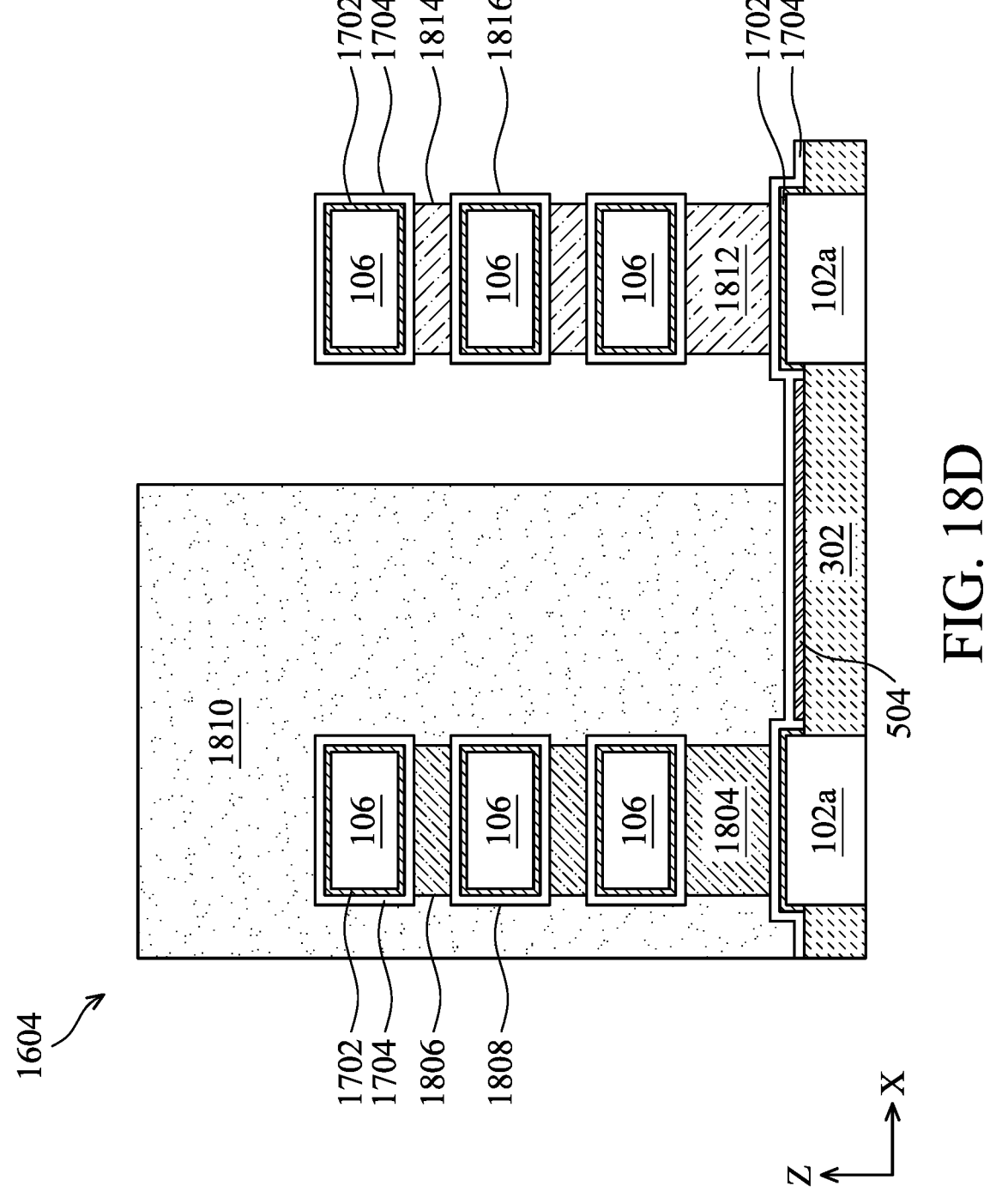

As shown in FIG. 18D, the mask 1802 is removed, and another mask 1810 is formed to cover the one or more WFM layers 1804 and the plurality of first semiconductor layers 106. After removing the mask 1802 and forming the mask 1810, one or more WFM layers 1812 is formed between vertically adjacent first semiconductor layers 106. The one or more WFM layers 1812 may be formed by the same processes as the one or more WFM layers 1804 as described in FIGS. 18B and 18C. The one or more WFM layers 1812 include an electrically conductive material, such as Ti, Al, Ta, $ZrSi_2$, TaN, $TaSi_x$, $MoSi_2$, $NiSi_x$, W, HfN, TiN, Mo, Ru, Jr, Pt, PtSi, MoN, or other suitable electrically conductive material. In some embodiments, the one or more WFM layers 1812 include n-type conductive material, such as Ti, Al, Ta, $ZrSi_2$, TaN, or p-type conductive material, such as Mo, Ru, Jr, Pt, PtSi, MoN. For example, the one or more WFM layers 1812 include n-type conductive material. As shown in FIG. 18D, each portion of the one or more WFM layers 1812 located between two vertically adjacent first semiconductor layers 106 has an edge surface 1814. In some embodiments, the edge surface 1814 is not flush with an outer surface 1816 of the gate dielectric layer 1704 surrounding the adjacent first semiconductor layer 106. In other words, the outer surface 1816 of the gate dielectric layer 1704 is misaligned with the edge surface 1814 of the one or more WFM layers 1812. In some embodiments, the edge surface 1814 is recessed from the outer surface 1816, as shown in FIG. 18D.

Figure 18E:
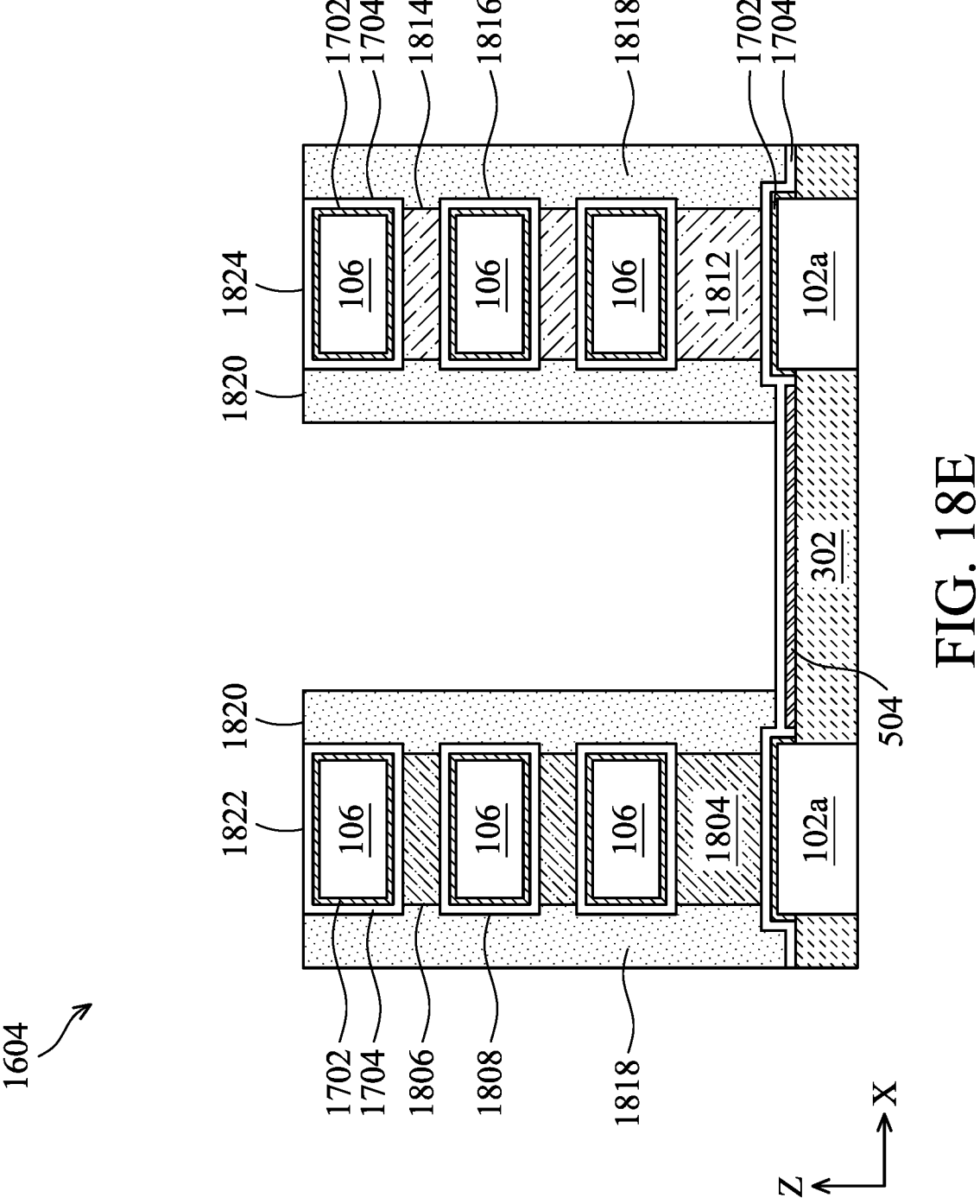

As shown in FIG. 18E, conductive layers 1818 are selectively formed from the one or more WFM layers 1804 and the one or more WFM layers 1812. In some embodiments, the conductive layers 1818 are tungsten containing layers, such as tungsten (W) layers formed using tungsten chloride ($WCl_x$) precursor. In some embodiments, some precursor may remain in the conductive layers 1818. In some embodiments, the conductive layers 1818 are fluorine-free tungsten (FFW) layers. The conductive layers 1818 may be grown from the metal or metal-containing surfaces, such as the edge surfaces 1806, 1814 of the one or more WFM layers 1804 and the one or more WFM layers 1812. The conductive layers 1818 may be in contact with the outer surfaces 1808, 1816 of the gate dielectric layers 1704. Each conductive layer 1818 has a top surface 1820. In some embodiments, the top surface 1820 may be substantially coplanar with top surfaces 1822, 1824 of the gate dielectric layers 1704, as shown in FIG. 18E. In some embodiments, the top surface 1820 may be at a level substantially higher than the top surfaces 1822, 1824. For each plurality of vertically aligned first semiconductor layers 106, two conductive layers 1818 are disposed on opposite sides of the first semiconductor layers 106, as shown in FIG. 18E. The two conductive layers 1818 are also disposed on opposite sides of the one or more WFM layers 1804 (or the one or more WFM layers 1812). In some embodiments, the one or more WFM layers 1804 include p-type conductive material, and the one or more WFM layers 1812 include n-type conductive material.

Figure 18F:
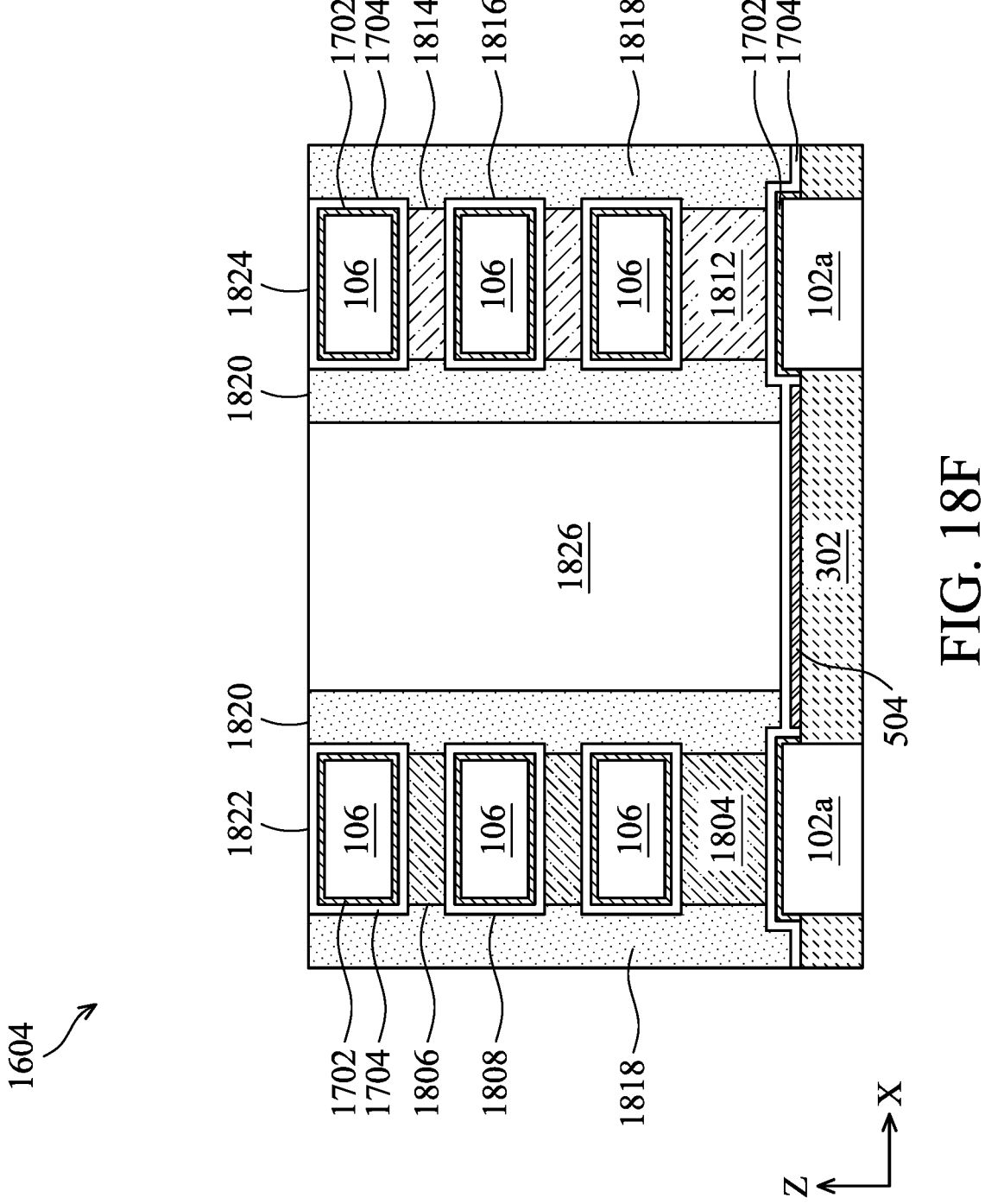

As shown in FIG. 18F, a dielectric material 1826 is disposed on the portion of the gate dielectric layer 1704 over the insulating material 302. The dielectric material 1826 may be any suitable dielectric material, such as SiOCN, SiCN, or SiN. The dielectric material 1826 may be formed between adjacent pluralities of first semiconductor layers 106. In some embodiments, the one or more WFM layers 1804 is in contact with a first conductive layer 1818, which is in contact with the dielectric material 1826, which is in contact with a second conductive layer 1818, which is in contact with the one or more WFM layers 1812.

In some embodiments, prior to forming the dielectric material 1826, the mask 1402 (FIG. 17A) formed in the S/D regions is removed, and the dielectric material 1826 is also formed on the liner 504 (FIG. 17A) between adjacent S/D epitaxial features 1002.

The dielectric material 1826 may be initially formed on the top surfaces 1820, 1822, 1824 and on the ILD layers 1204 (FIG. 17A), and an etch back process may be performed to remove portions of the dielectric material 1826 to expose the ILD layers 1204 and the top surfaces 1820, 1822, 1824.

Figure 18G:
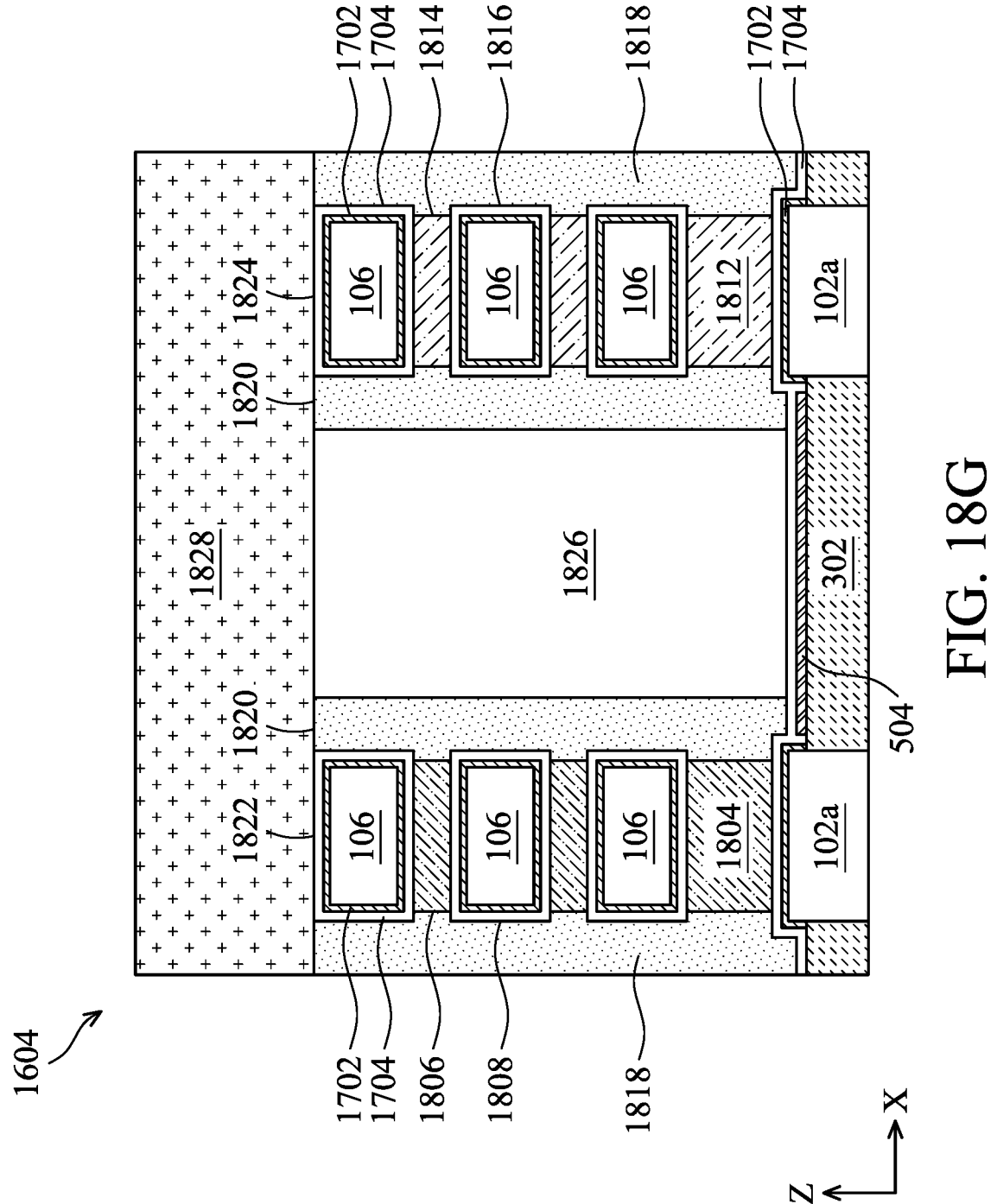

As shown in FIG. 18G, a conductive layer 1828 is formed on the conductive layers 1818, the dielectric material 1826, and the gate dielectric layer 1704. The conductive layer 1828 includes the same material as the conductive layers 1818, and the interfaces between the conductive layer 1828 and the conductive layers 1818 are homogeneous. The homogeneous interface between the conductive layer 1828 and the conductive layers 1818 can reduce electrical resistance compared to a heterogeneous interface between two different conductive materials. The conductive layer 1828 may be formed by any suitable process, such as PVD or ECP.

Figure 18H:
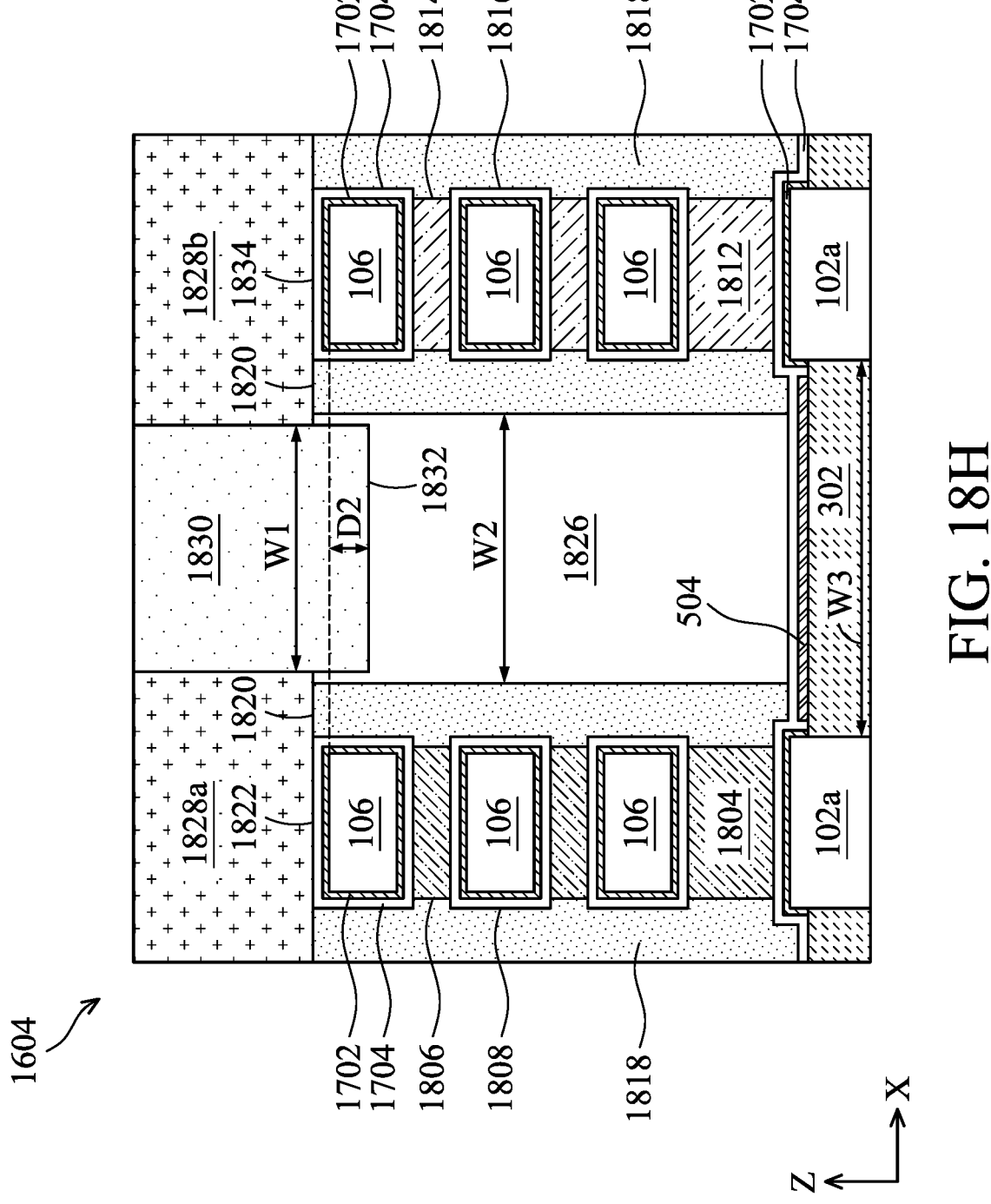

As shown in FIG. 18H, a dielectric material 1830 is formed in the conductive layer 1828. In some embodiments, the dielectric material 1830 is formed in the dielectric material 1826. The dielectric material 1830 may include any suitable dielectric material, such as SiN. The dielectric material 1830 separates the conductive layer 1828 into two portions 1828a, 1828b. In some embodiments, the one or more WFM layers 1804, the conductive layers 1818 located on opposite sides of the one or more WFM layers 1804, and the portion 1828a of the conductive layer 1828 in contact with the conductive layers 1818 form a first gate electrode layer. The one or more WFM layers 1812, the conductive layers 1818 located on opposite sides of the one or more WFM layers 1812, and the portion 1828b of the conductive layer 1828 in contact with the conductive layers 1818 form a second gate electrode layer. The first and second gate electrode layers are separated by the dielectric material 1826 and the dielectric material 1830.

The dielectric material 1830 may be formed by first forming an opening in the conductive layer 1828. In some embodiments, the opening may extend into the dielectric material 1826. In some embodiments, the opening does not extend into the dielectric material 1826. The dielectric material 1830 is then formed in the opening and on the conductive layer 1828. The portion of the dielectric material 1830 formed on the conductive layer 1828 is then removed by any suitable process, such as a planarization process or an etch back process. As shown in FIG. 18H, the dielectric material 1830 has a width W1 along the X direction, the dielectric material 1826 has a width W2, and the insulating material 302 between the substrate portions 102a, 102b has a width W3. In some embodiments, the width W1 is less than the width W2, which is less than the width W3. If the width W1 is greater than the width W2, the contact area between the conductive layer 1818 and the conductive layer 1828 is reduced, leading to increased electrical resistance. In some embodiments, a major top surface 1832 of the dielectric material 1826 is located at a level below the level of a top surface 1834 of the topmost first semiconductor layer 106 by a distance D2. The distance D2 may range from about 10 nm to about 20 nm.

Figures 19A, 19B:
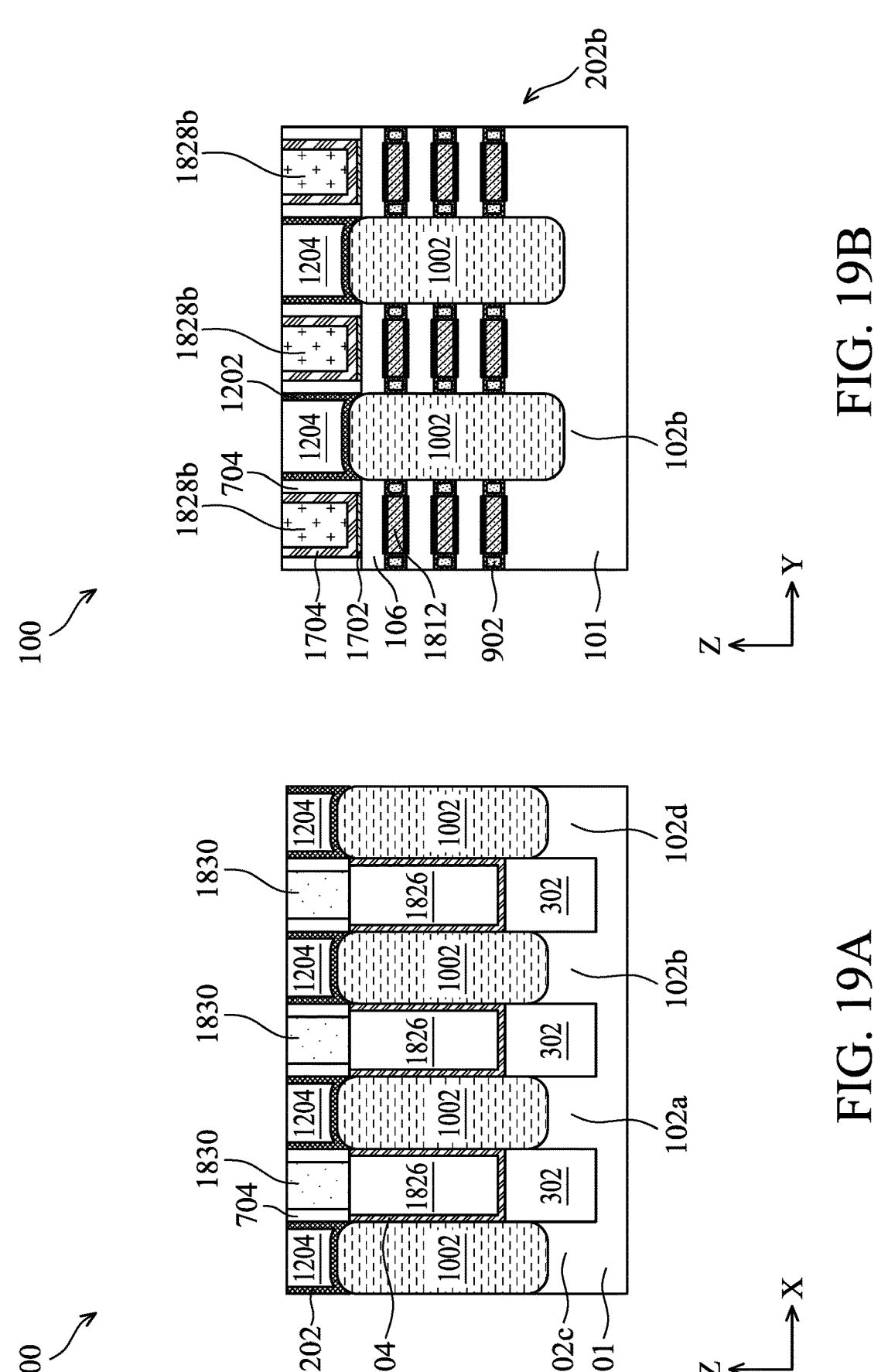
FIGS. 19A and 19B are cross-sectional side views of one of various stages of manufacturing the semiconductor device structure taken along lines A-A, B-B of FIG. 11, respectively, in accordance with some embodiments.

FIGS. 19A and 19B are cross-sectional side views of one of various stages of manufacturing the semiconductor device structure 100 taken along lines A-A, B-B of FIG. 11, respectively, in accordance with some embodiments. As shown in FIG. 19A, the dielectric material 1830 is disposed on the dielectric material 1826 between adjacent S/D epitaxial features 1002. After filling the opening in the conductive layer 1828 with the dielectric material 1830, a planarization process may be performed to expose the ILD layers 1204 and the conductive layer 1828 (1828a, 1828b), as shown in FIGS. 19A and 19B.

Subsequently, conductive features (not shown) may be formed through the ILD layer 1204 and the CESL 1202 to be in contact with the S/D epitaxial features 1002 via silicide layers (not shown). The conductive feature may include a metal, such as cobalt or tungsten. In some embodiments, the conductive feature includes a glue layer, such as a TiN layer, and the metal is disposed on the glue layer.

Figure 20:
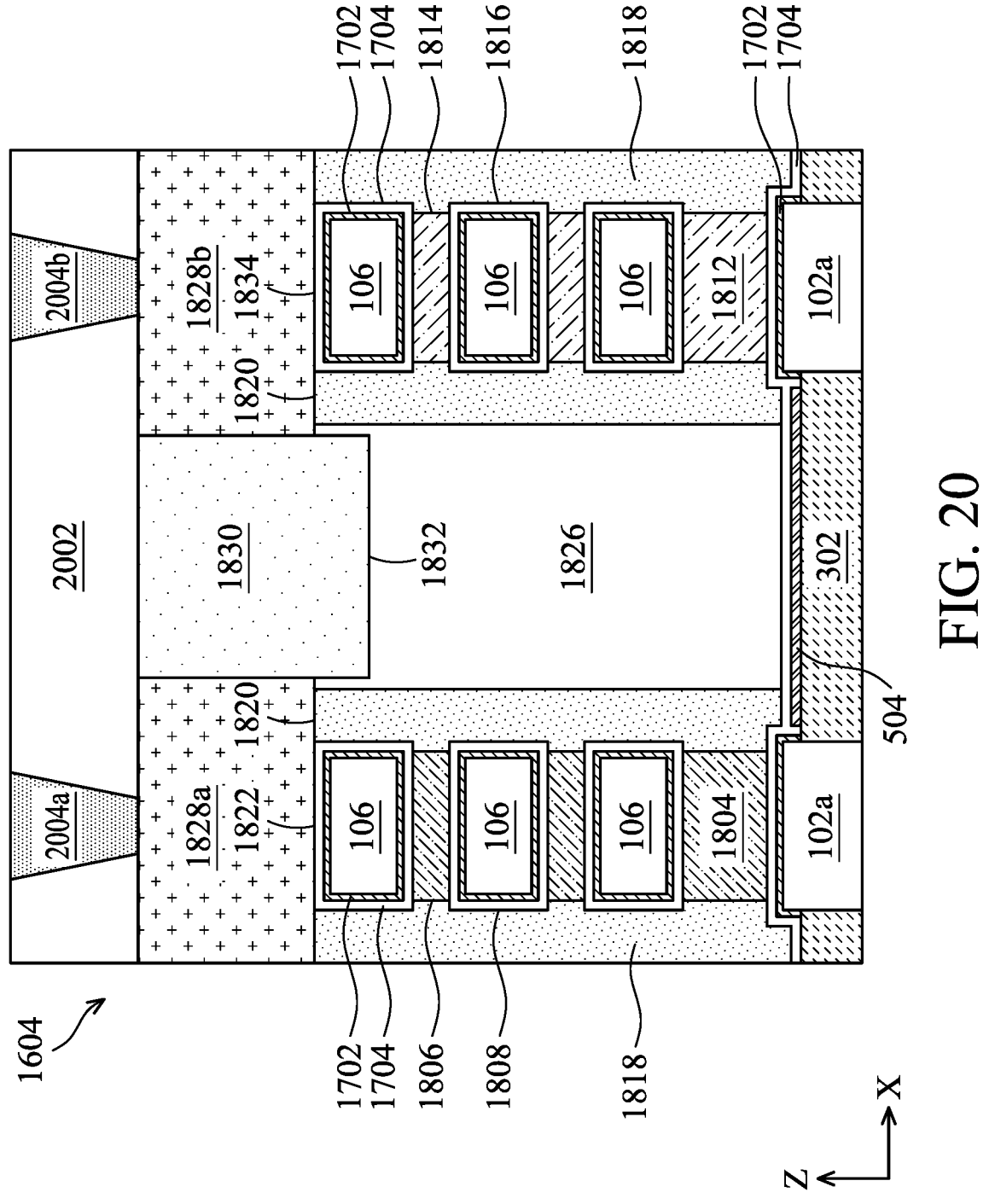
FIG. 20 is a cross-sectional view of one of various stages of manufacturing the semiconductor device structure, in accordance with some embodiments.

As shown in FIG. 20, a dielectric layer 2002 is formed on the portions 1828a, 1828b of the conductive layer 1828 and the dielectric material 1830, and conductive features 2004a, 2004b are formed in the dielectric layer 2002. The dielectric layer 2002 may include the same material as the ILD layer 1204. The conductive features 2004a, 2004b are electrically connected to portions 1828a, 1828b of the conductive layer 1828, respectively. The conductive features 2004a, 2004b may include a metal, such as tungsten. In some embodiments, the precursor used to form the conductive features 2004a, 2004b is $WF_6$. In some embodiments, the precursor used to form the conductive features 2004a, 2004b cannot be $WCl_5$. As described above, the first and second gate electrode layers each includes homogeneous interfaces between the conductive layers 1818 and the portions 1828a, 1828b of the conductive layer 1828. As a result, electrical resistance in the gate electrode layers is reduced. For example, the highest electrical resistance in the gate electrode layer is at the interfaces between the conductive layers 1818 and the one or more WFM layers 1804 (or one or more WFM layers 1812), and because at least two sides of each of the first semiconductor layers 106 are surrounded by the conductive layers 1818, the effect of the high electrical resistance at the interfaces between the conductive layers 1818 and the one or more WFM layers 1804 (or one or more WFM layers 1812) is substantially reduced.

The present disclosure provides a semiconductor device structure 100 including a gate electrode layer having one or more WFM layers 1804, two conductive layers 1818 disposed on opposite sides of the one or more WFM layers 1804, and a portion 1828a of the conductive layer 1828 disposed on the conductive layers 1818. The conductive layers 1818 and the conductive layer 1828 include the same conductive material, and the interfaces between the conductive layers 1818 and the conductive layer 1828 are homogeneous. Some embodiments may achieve advantages. For example, the homogeneous interfaces in the gate electrode layer reduce electrical resistance in the gate electrode layer.

An embodiment is a semiconductor device structure. The structure includes a first plurality of vertically aligned semiconductor layers disposed over a substrate and a first gate electrode layer surrounding each of the first plurality of vertically aligned semiconductor layers. The first gate electrode layer includes first one or more work function metal layers disposed between adjacent semiconductor layers of the first plurality of vertically aligned semiconductor layers and two first conductive layers disposed on opposite sides of the first one or more work function metal layers. The first conductive layers include a material different from the first one or more work function metal layers. The first gate electrode layer further includes a second conductive layer disposed on the first conductive layers, and the second conductive layer and the first conductive layers include a same material.

Another embodiment is a semiconductor device structure. The structure includes a first plurality of semiconductor layers disposed over a substrate and a plurality of gate dielectric layers. Each gate dielectric layer of the plurality of gate dielectric layers surrounds a corresponding semiconductor layer of the first plurality of semiconductor layers, and each gate dielectric layer includes an outer surface. The semiconductor device structure further includes first one or more work function metal layers disposed between adjacent semiconductor layers of the first plurality of semiconductor layers, and the first one or more work function metal layers include an edge surface recessed from the outer surface of the gate dielectric layer. The semiconductor device structure further includes two first conductive layers disposed on opposite sides of and in contact with the first one or more work function metal layers, and the first conductive layers are in contact with the outer surfaces of the gate dielectric layers of the plurality of gate dielectric layers. The semiconductor device structure further includes a second conductive layer disposed on and in contact with the first conductive layers.

A further embodiment is a method. The method includes forming first and second fins from a substrate. The first fin includes a first plurality of semiconductor layers and the second fin includes a second plurality of semiconductor layers. The method further includes depositing first one or more work function metal layers between adjacent semiconductor layers of the first plurality of semiconductor layers, recessing the first one or more work function metal layers, depositing second one or more work function metal layers between adjacent semiconductor layers of the second plurality of semiconductor layers, recessing the second one or more work function metal layers, selectively forming first conductive layers on opposite sides of the first one or more work function metal layers and on opposite sides of the second one or more work function metal layers, and forming a second conductive layer on the first conductive layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
forming first and second fins from a substrate, wherein the first fin includes a first plurality of semiconductor layers and the second fin includes a second plurality of semiconductor layers;
depositing a gate dielectric layer around the first plurality of semiconductor layers, wherein the gate dielectric layer has an outer surface;
depositing first one or more work function metal layers between adjacent semiconductor layers of the first plurality of semiconductor layers;
recessing the first one or more work function metal layers, wherein an edge surface of the first one or more work function metal layers is recessed from the outer surface of the gate dielectric layer;

depositing second one or more work function metal layers between adjacent semiconductor layers of the second plurality of semiconductor layers;
recessing the second one or more work function metal layers;
selectively forming first conductive layers on opposite sides of the first one or more work function metal layers and on opposite sides of the second one or more work function metal layers; and
forming a second conductive layer on the first conductive layers.

2. The method of claim 1, further comprising forming a first dielectric material between one of the first conductive layers in contact with the first one or more work function metal layers and one of the first conductive layers in contact with the second one or more work function metal layers prior to forming the second conductive layer.

3. The method of claim 2, further comprising forming a second dielectric material in the second conductive layer, wherein the second dielectric material is in contact with the first dielectric material.

4. The method of claim 3, further comprising forming a liner between the first and second fins.

5. The method of claim 4, further comprising removing vertical portions of the liner, wherein a horizontal portion of the liner remains.

6. A method for forming a semiconductor device structure, comprising:
forming first and second fins from a substrate, wherein the first fin includes a first plurality of semiconductor layers and the second fin includes a second plurality of semiconductor layers;
forming a dielectric feature between the first and second fins;
forming a sacrificial gate electrode layer above the first and second fins and the dielectric feature;
performing a planarization process to expose the dielectric feature;
removing the dielectric feature;
removing the sacrificial gate electrode layer;
depositing a gate dielectric layer around the first plurality of semiconductor layers, wherein the gate dielectric layer has an outer surface;
depositing first one or more work function metal layers between adjacent semiconductor layers of the first plurality of semiconductor layers;
recessing the first one or more work function metal layers, wherein an edge surface of the first one or more work function metal layers is recessed from the outer surface of the gate dielectric layer; and
selectively forming first conductive layers on opposite sides of the first one or more work function metal layers.

7. The method of claim 6, wherein the first fin comprises a first sacrificial layer disposed over the first plurality of semiconductor layers.

8. The method of claim 7, wherein the dielectric feature comprises a liner and a second sacrificial layer disposed on the liner.

9. The method of claim 8, wherein a top surface of the first sacrificial layer and a top surface of the second sacrificial layer are coplanar.

10. The method of claim 9, further comprising removing the first sacrificial layer.

11. The method of claim 6, further comprising forming a first mask around the second plurality of semiconductor layers prior to the depositing of the first one or more work function metal layers.

12. The method of claim 11, further comprising removing the first mask after the depositing of the first one or more work function metal layers.

13. The method of claim 12, further comprising depositing a second mask around the first plurality of semiconductor layers and the first one or more work function metal layers.

14. The method of claim 13, further comprising depositing second one or more work function metal layers between adjacent semiconductor layers of the second plurality of semiconductor layers.

15. The method of claim 14, further comprising selectively depositing second conductive layers on opposite sides of the second one or more work function metal layers.

16. The method of claim 15, wherein the first and second conductive layers are selectively deposited at a same time.

17. A method for forming a semiconductor device structure, comprising:

forming a fin from a substrate, wherein the fin includes a plurality of semiconductor layers;

forming a sacrificial layer adjacent the fin;

forming a sacrificial gate stack above a first portion of the fin and a first portion of the sacrificial layer;

depositing a spacer around the sacrificial gate stack, on a second portion of the fin, and on a second portion of the sacrificial layer;

removing portions of the spacer formed on horizontal surfaces;

forming source/drain epitaxial features adjacent the second portion of the sacrificial layer; then removing the sacrificial layer;

depositing a first dielectric material adjacent the source/drain epitaxial feature; and depositing a second dielectric material on the first dielectric material, wherein the second dielectric material is adjacent the spacer.

18. The method of claim 17, further comprising depositing one or more work function metal layers between adjacent semiconductor layers of the plurality of semiconductor layers.

19. The method of claim 18, further comprising selectively depositing first conductive layers on opposite sides of the one or more work function metal layers, wherein the first dielectric material is deposited adjacent the first conductive layer.

20. The method of claim 19, further comprising depositing a second conductive layer on the first conductive layers and the first dielectric material, wherein the second dielectric material is formed through the second conductive layer.

* * * * *